(12) United States Patent
Hotta

(10) Patent No.: US 7,256,457 B2
(45) Date of Patent: Aug. 14, 2007

(54) THIN-FILM TRANSISTOR DEVICE, UTILIZING DIFFERENT TYPES OF THIN FILM TRANSISTORS

(75) Inventor: Kazushige Hotta, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 105 days.

(21) Appl. No.: 10/941,543

(22) Filed: Sep. 15, 2004

(65) Prior Publication Data

US 2005/0070054 A1   Mar. 31, 2005

(30) Foreign Application Priority Data

Sep. 30, 2003  (JP)  ............................. 2003-339167

(51) Int. Cl.
*H01L 27/12* (2006.01)
(52) U.S. Cl. ...................... 257/347; 257/213; 257/288; 257/E29.137
(58) Field of Classification Search ...................... None
See application file for complete search history.

(56) References Cited

U.S. PATENT DOCUMENTS

| 6,049,092 | A  |   | 4/2000 | Konuma et al. |
|-----------|----|---|--------|---------------|
| 6,225,150 | B1 | * | 5/2001 | Lee et al. ........... 438/153 |
| 6,235,558 | B1 |   | 5/2001 | Oda et al. |
| 6,403,406 | B2 |   | 6/2002 | Lee et al. |
| 6,576,926 | B1 | * | 6/2003 | Yamazaki et al. |
| 2003/0100152 | A1 | | 5/2003 | Konuma et al. |

FOREIGN PATENT DOCUMENTS

| EP | 645 802 | 3/1995 |
|----|---------|--------|
| JP | 2000-294787 | 10/2000 |
| JP | 2001-013524 | 1/2001 |
| JP | 2002-134751 | 5/2002 |
| JP | 2002-252231 | 9/2002 |
| JP | 2002-313802 | 10/2002 |
| JP | 2003-023014 | 1/2003 |

* cited by examiner

*Primary Examiner*—Leonardo Andujar
*Assistant Examiner*—Kevin Quinto
(74) *Attorney, Agent, or Firm*—Greer, Burns & Crain, Ltd

(57) ABSTRACT

A TFT device, a method of manufacturing the same, a TFT substrate and a display device, making it possible to decrease the photolithography steps, to improve the productivity and to decrease the cost of production. There are formed on the same substrate a first n-ch TFT having an LDD region which is entirely covered with a gate electrode, a second n-ch TFT having an LDD region partially covered with a gate electrode, and a p-ch TFT. Here, electrically conducting thin films and a gate electrode are formed on the electrically conducting thin film and on the insulating film, phosphorus ions are implanted into source/drain regions of the n-ch TFTs using the electrically conducting thin films and gate electrode as masks, and a gate electrode is formed by etching the electrically conducting thin film by using the electrically conducting thin film as a mask.

9 Claims, 41 Drawing Sheets

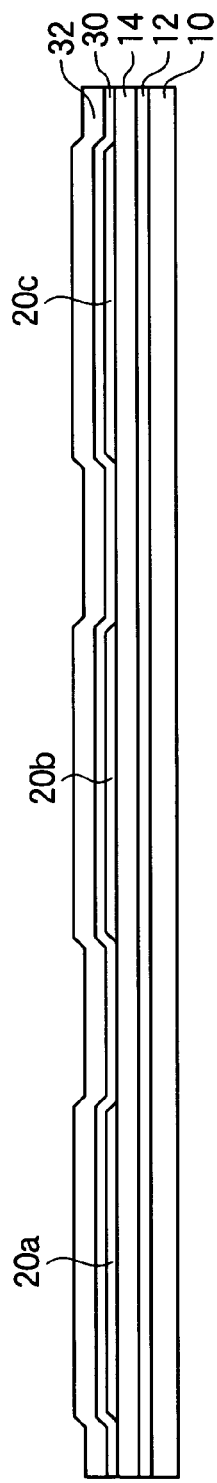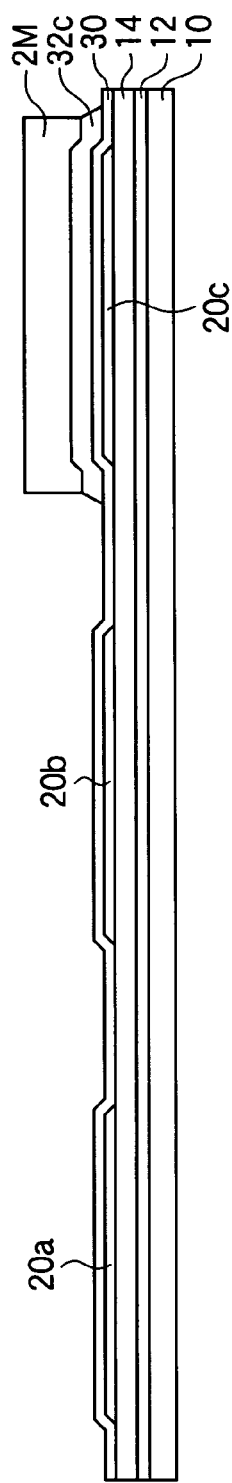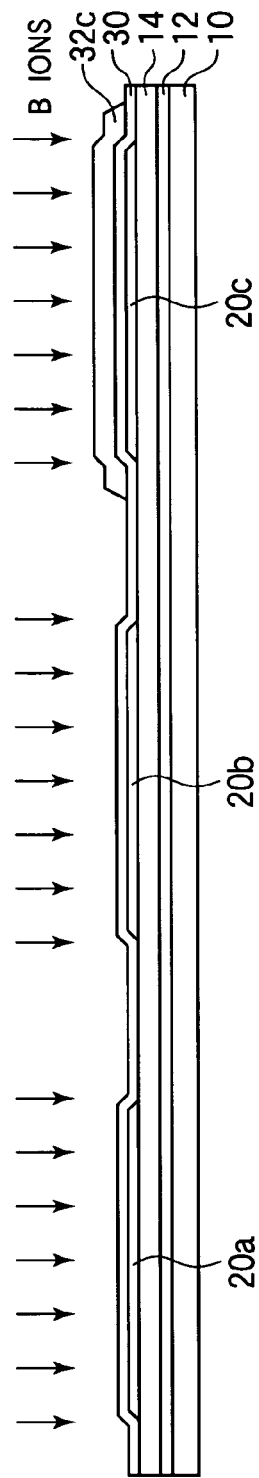

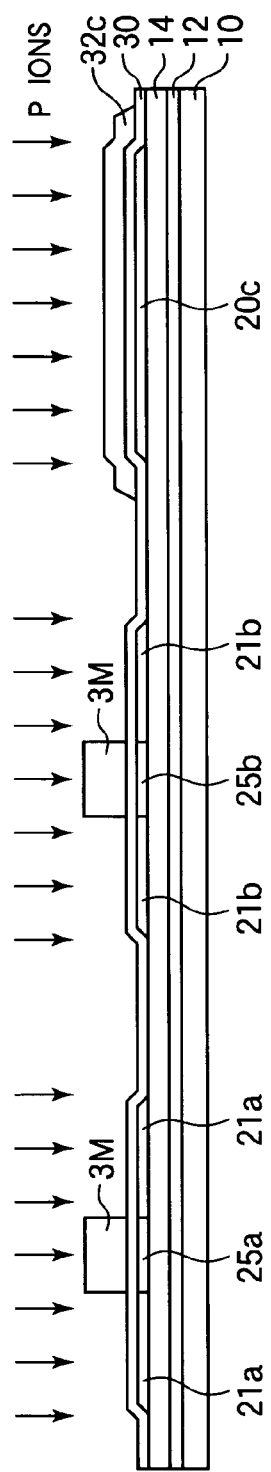

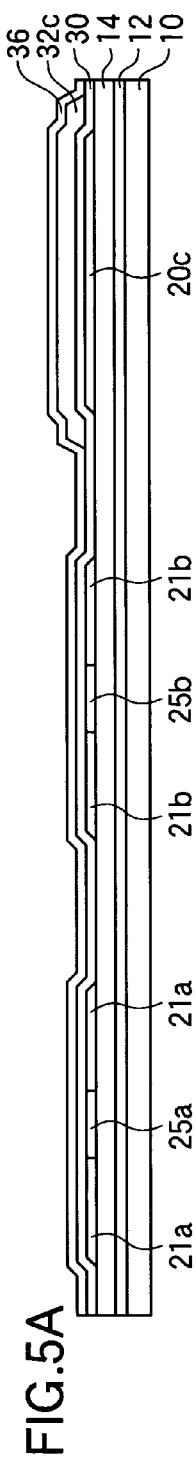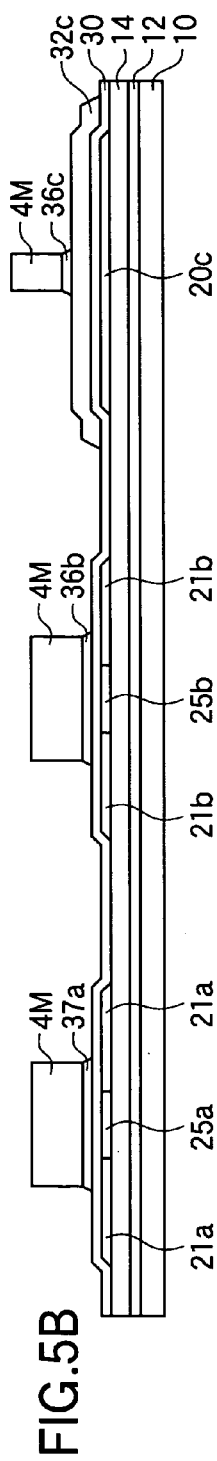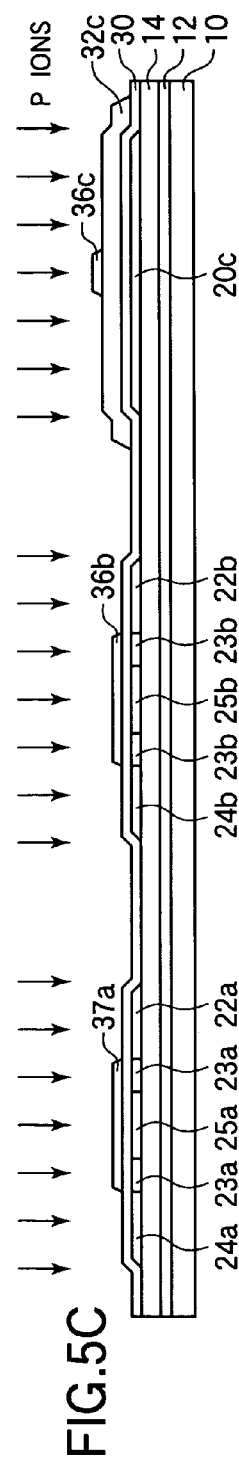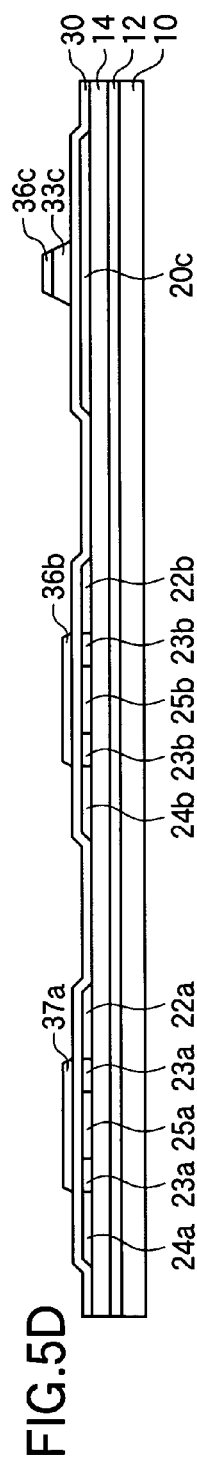

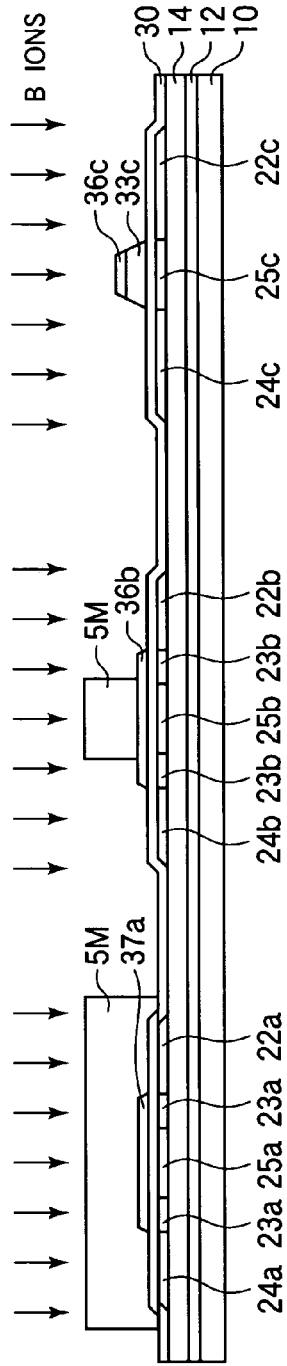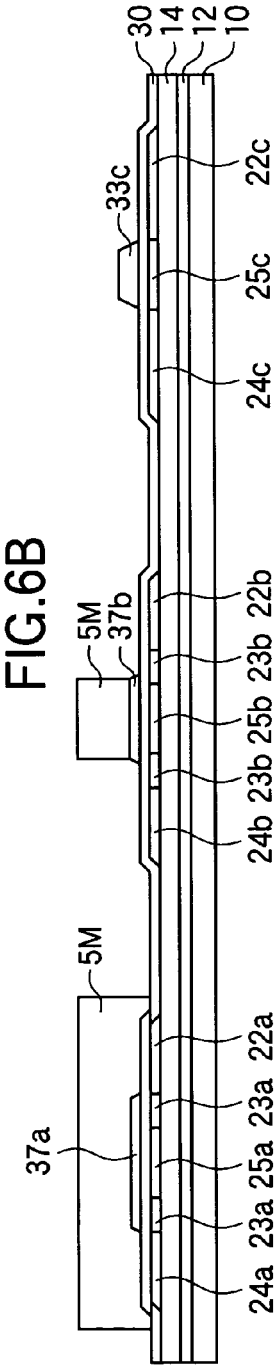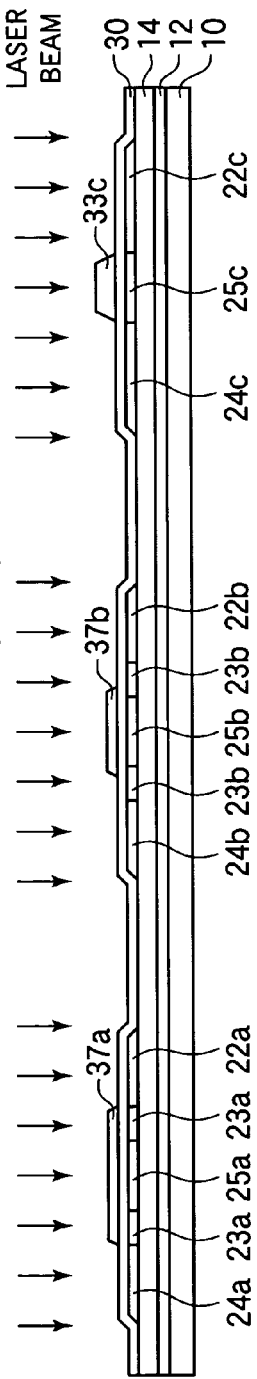

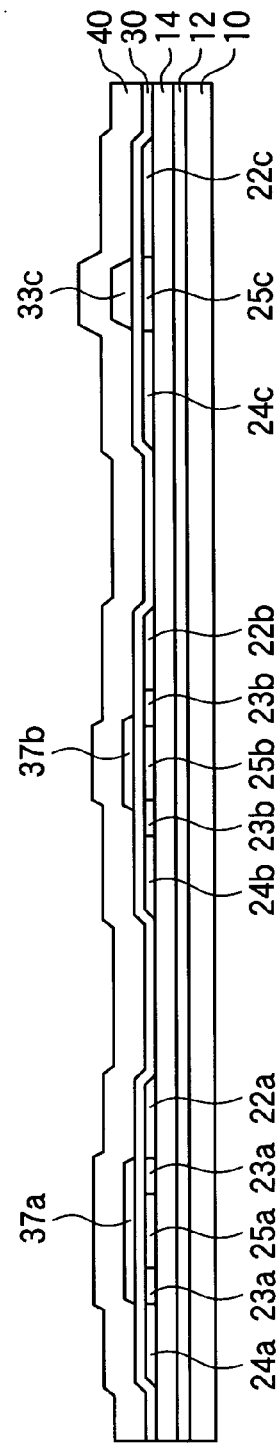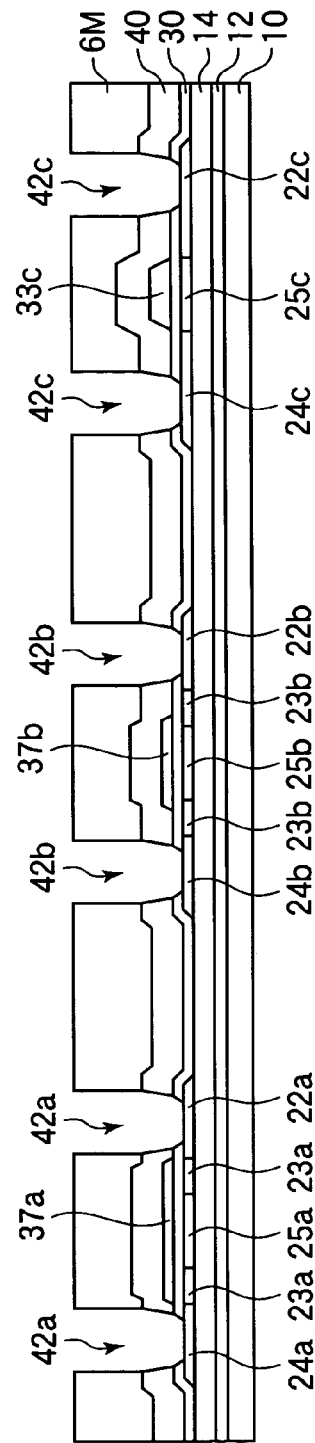

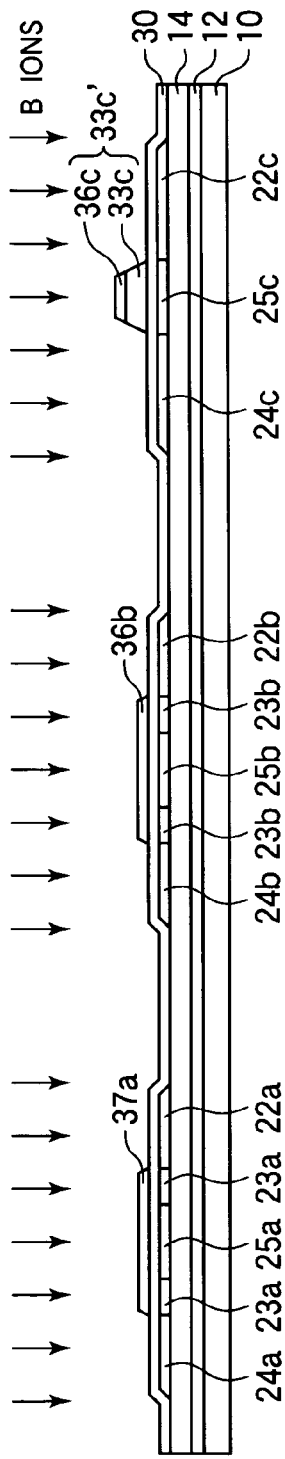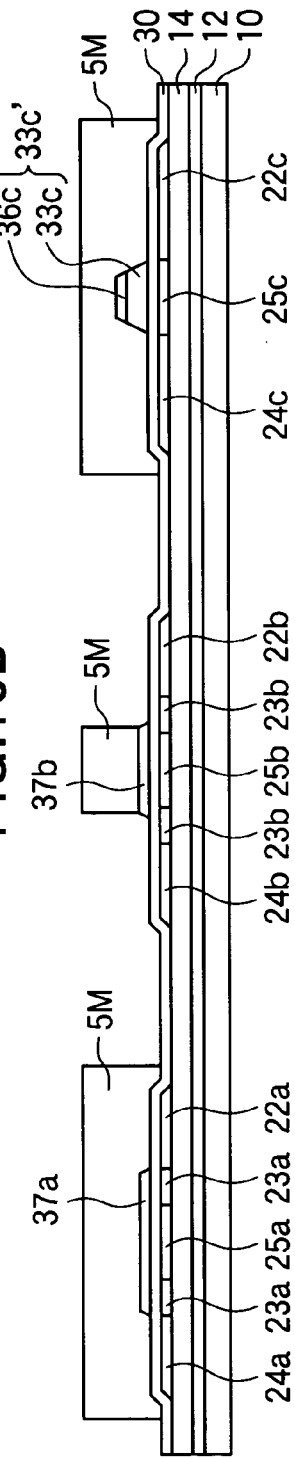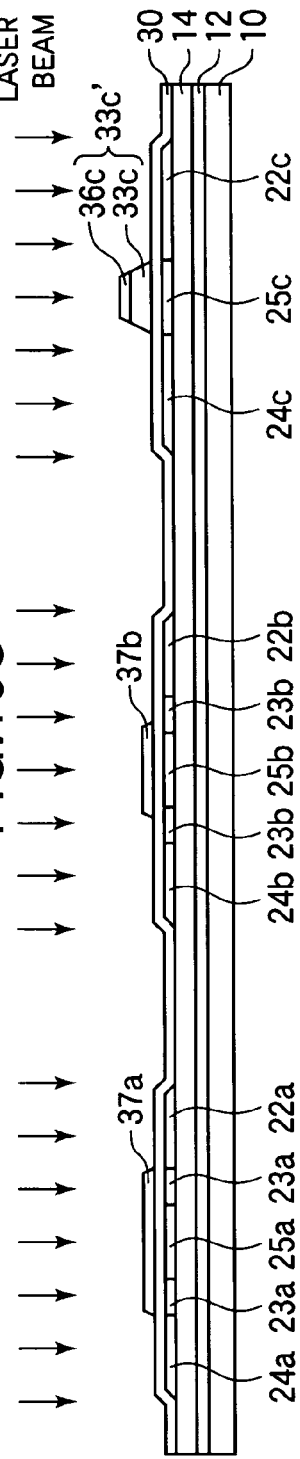

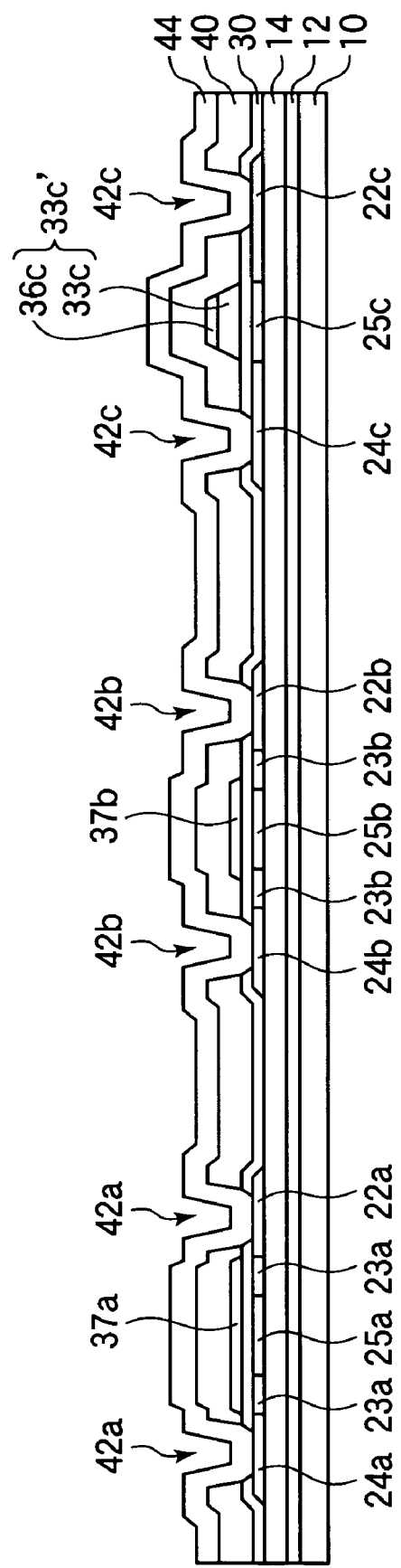

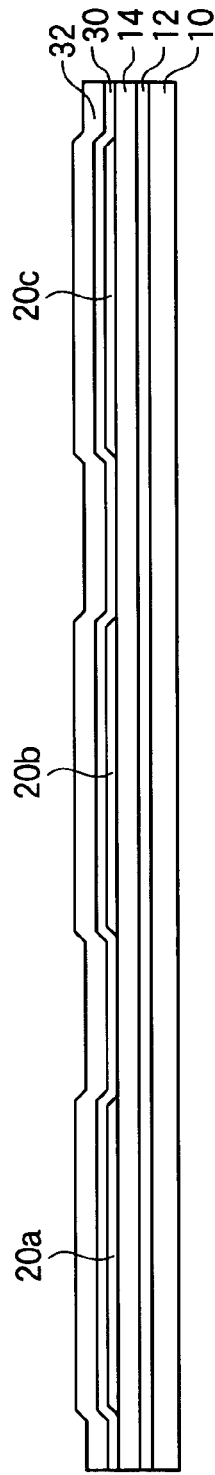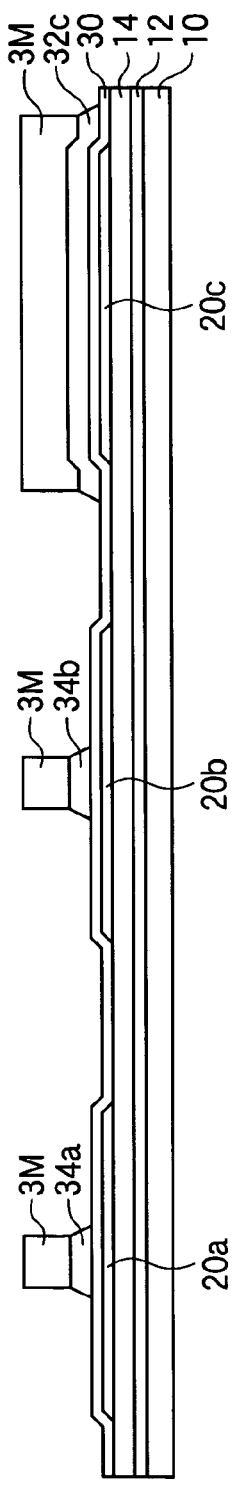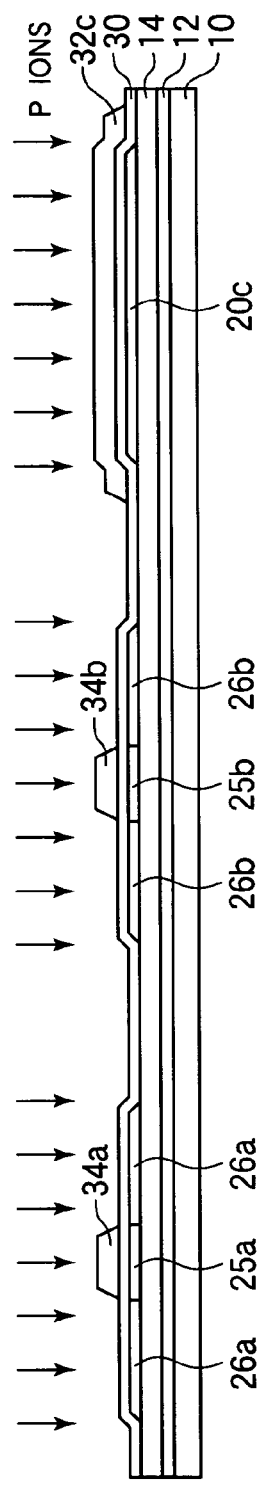

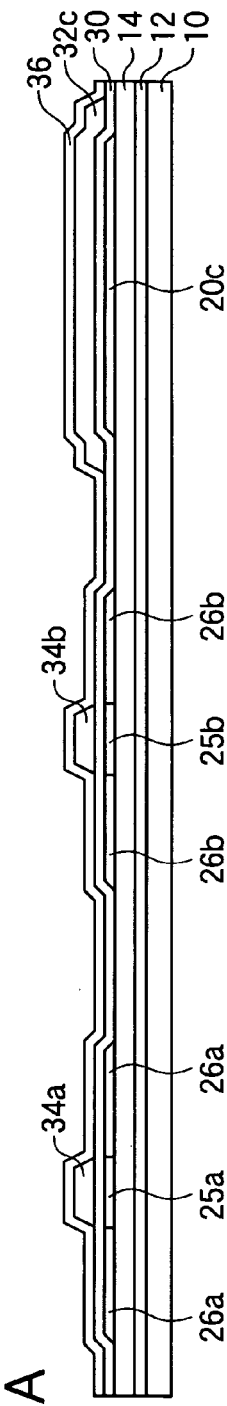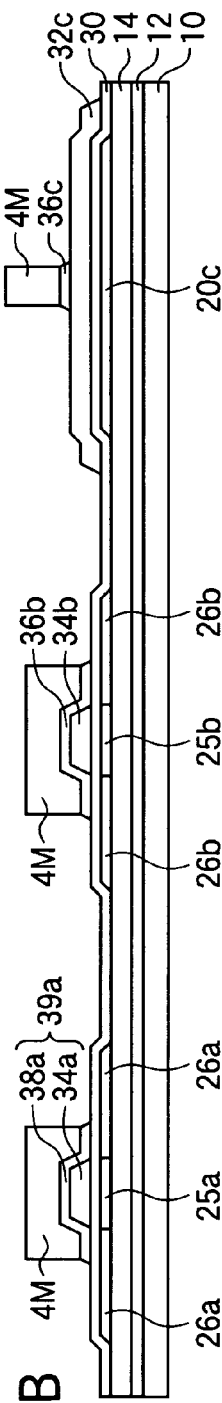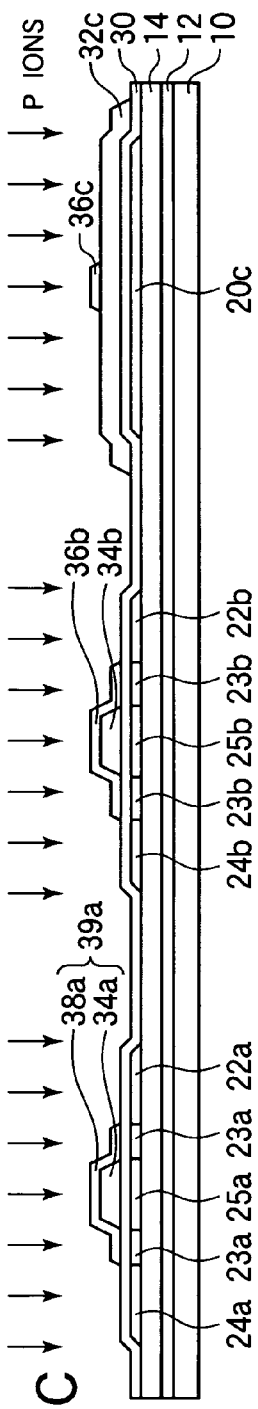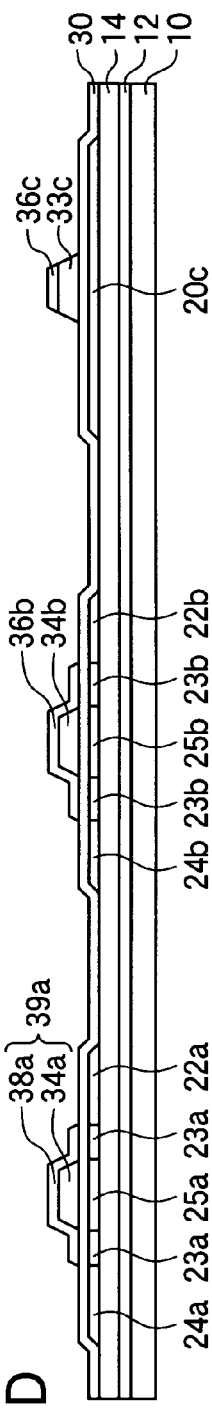

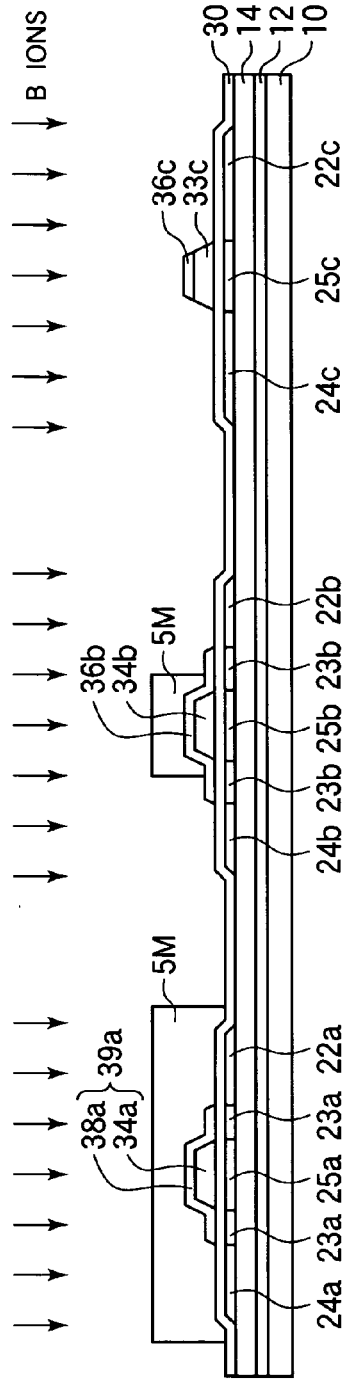
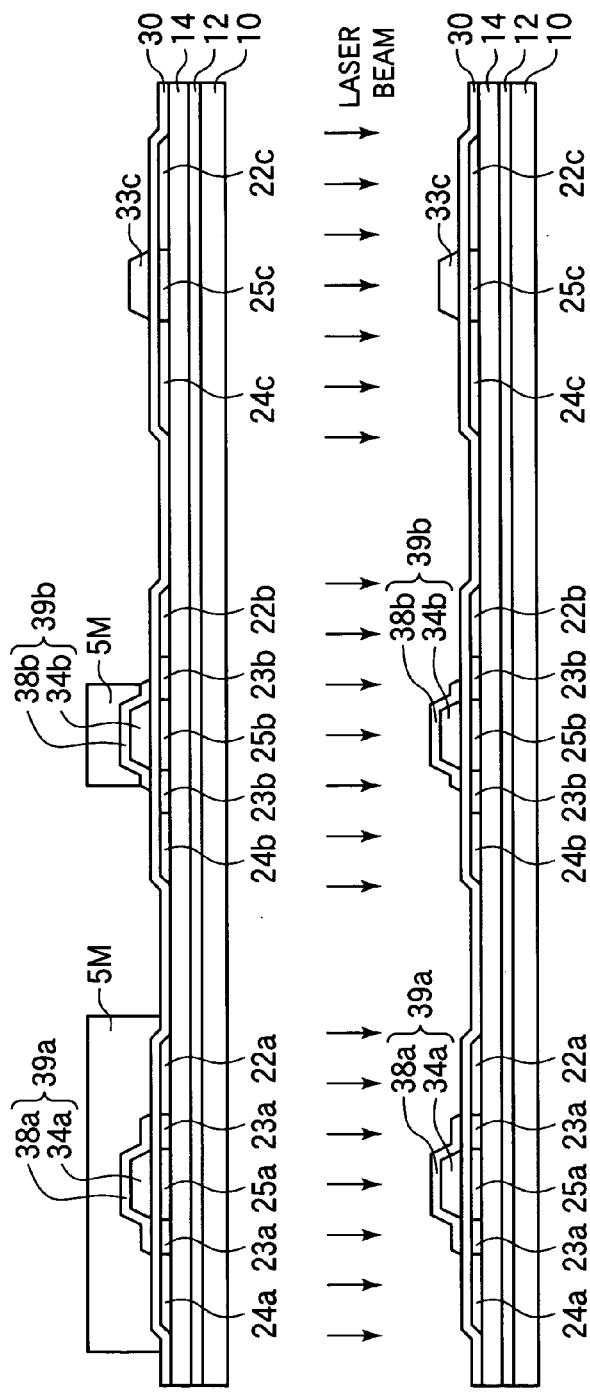
FIG.17A
FIG.17B
FIG.17C

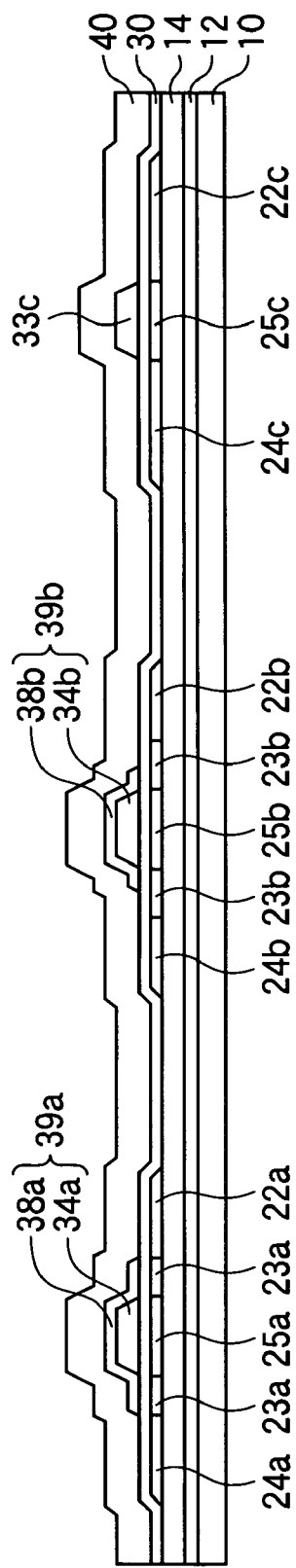
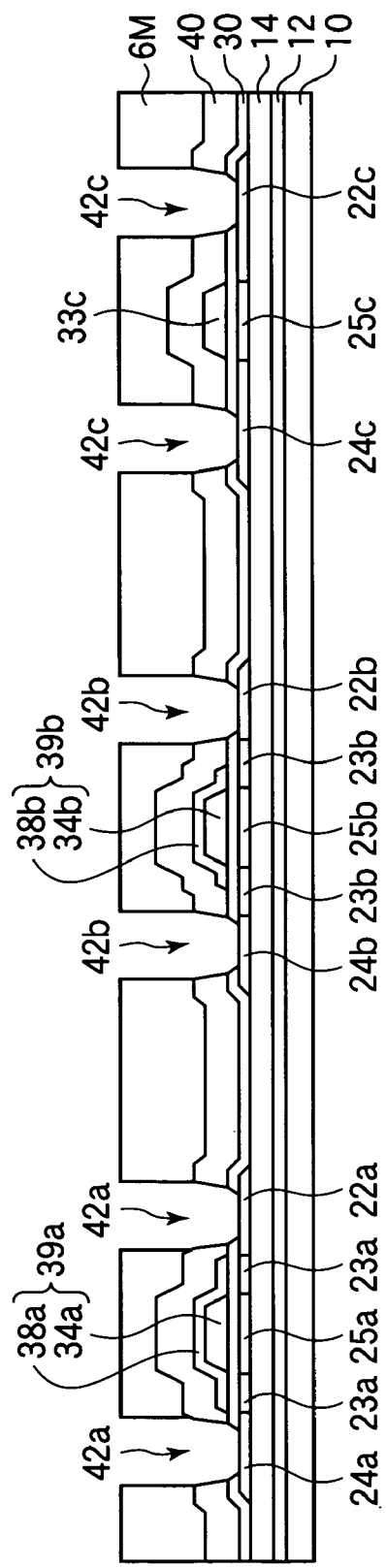
FIG.18A
FIG.18B

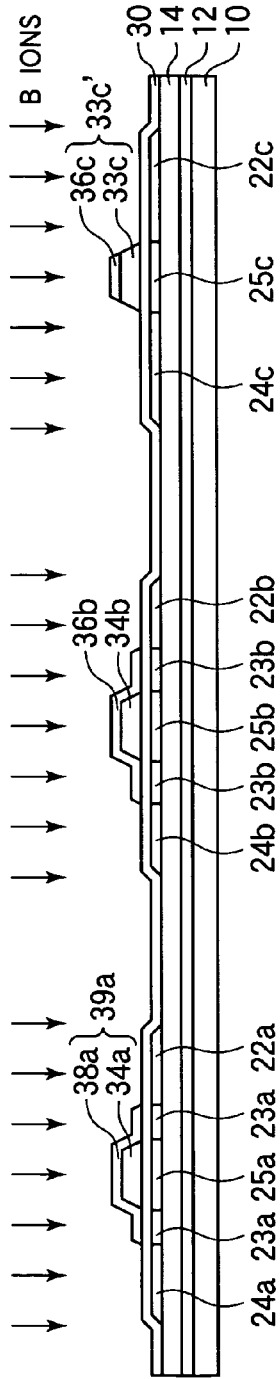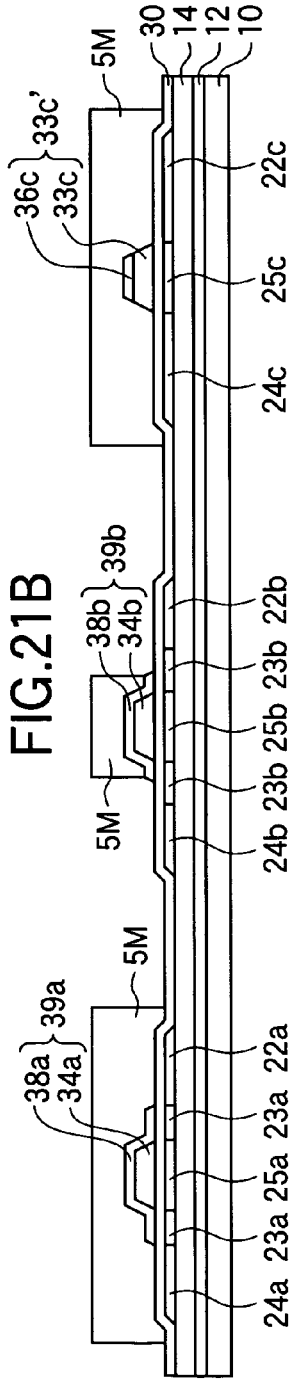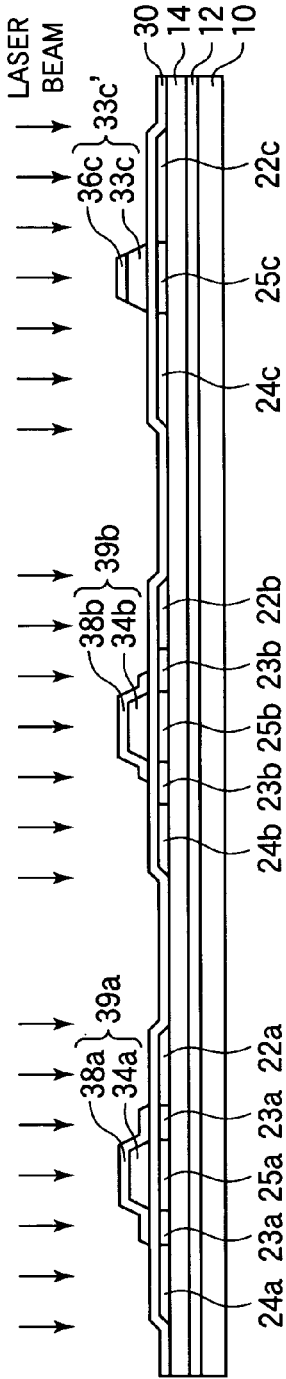

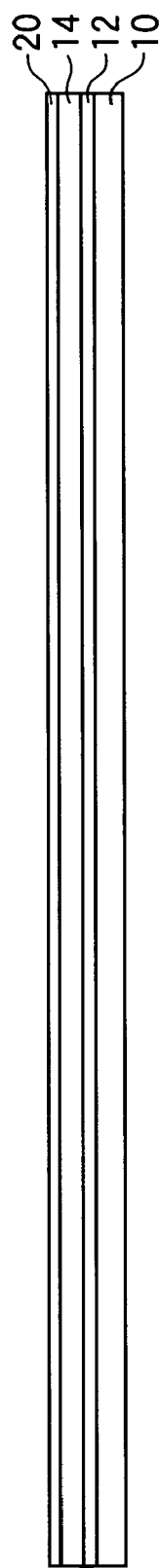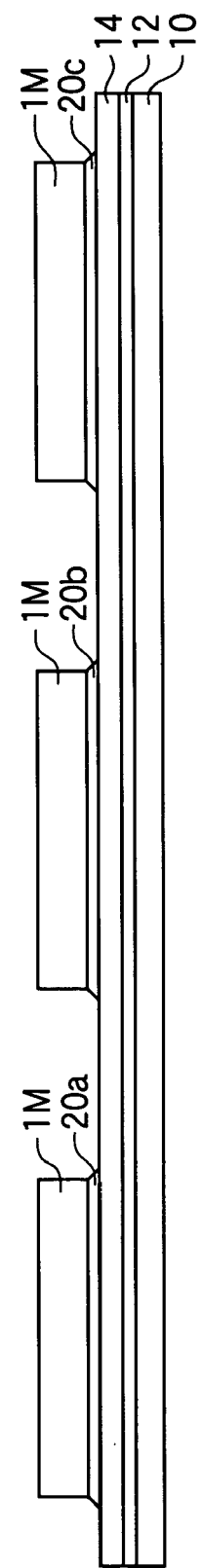

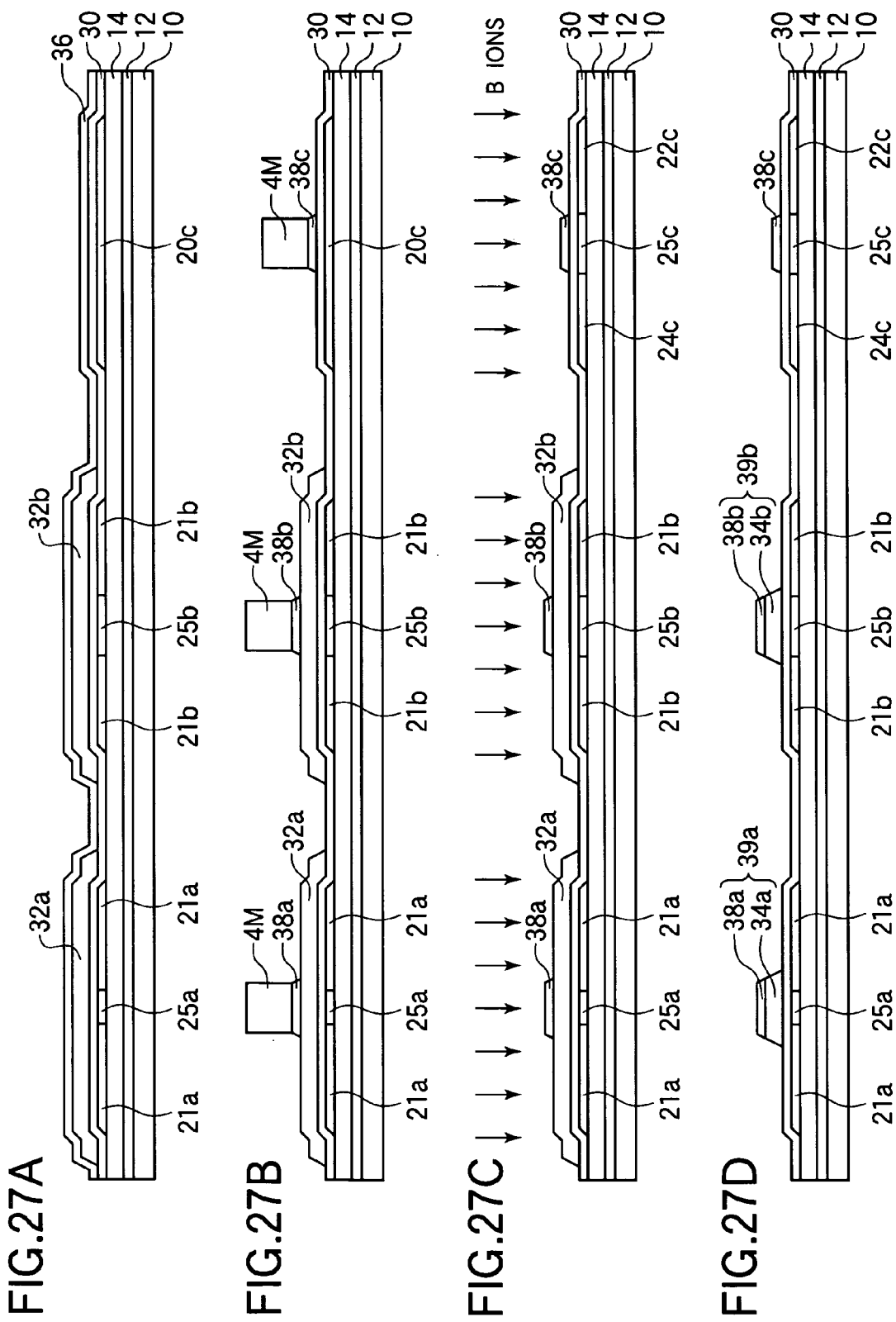

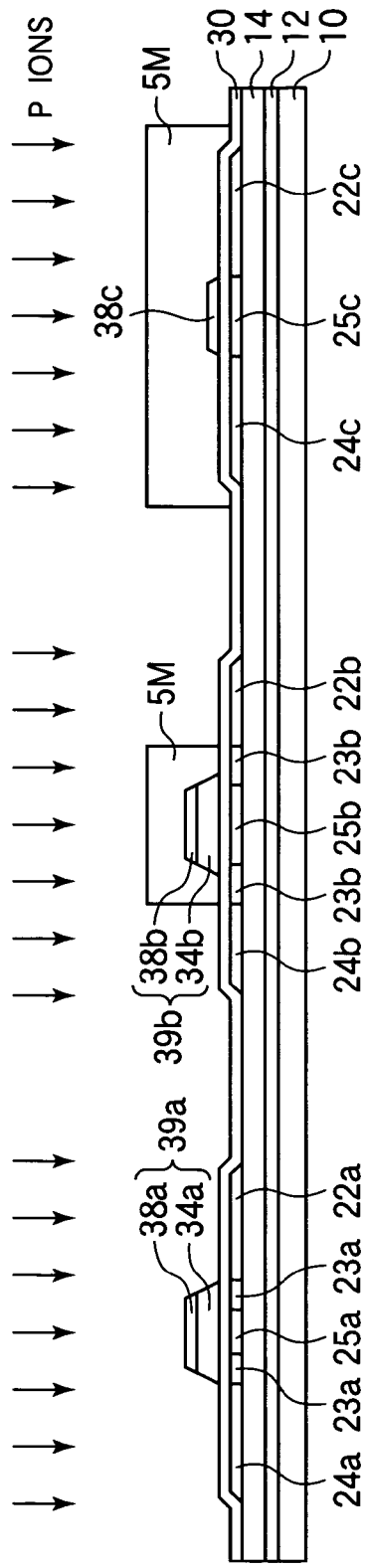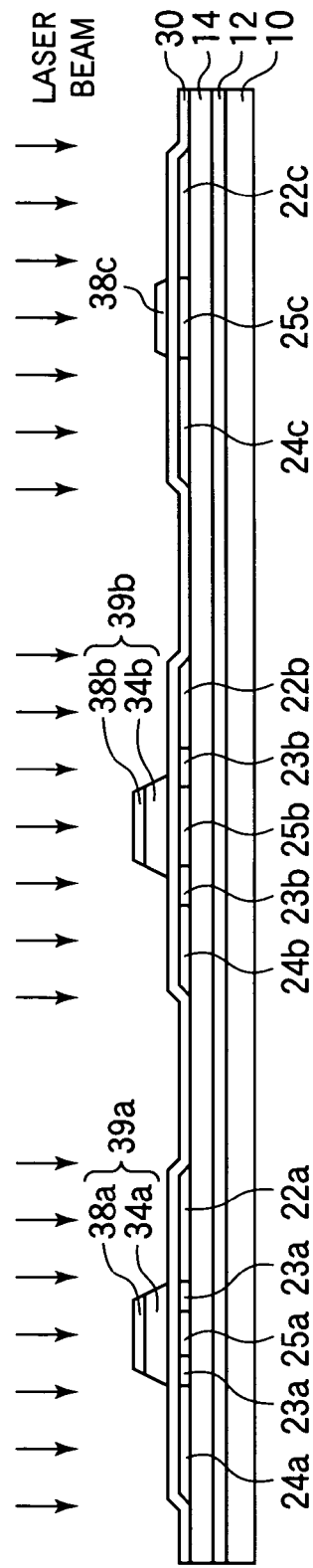

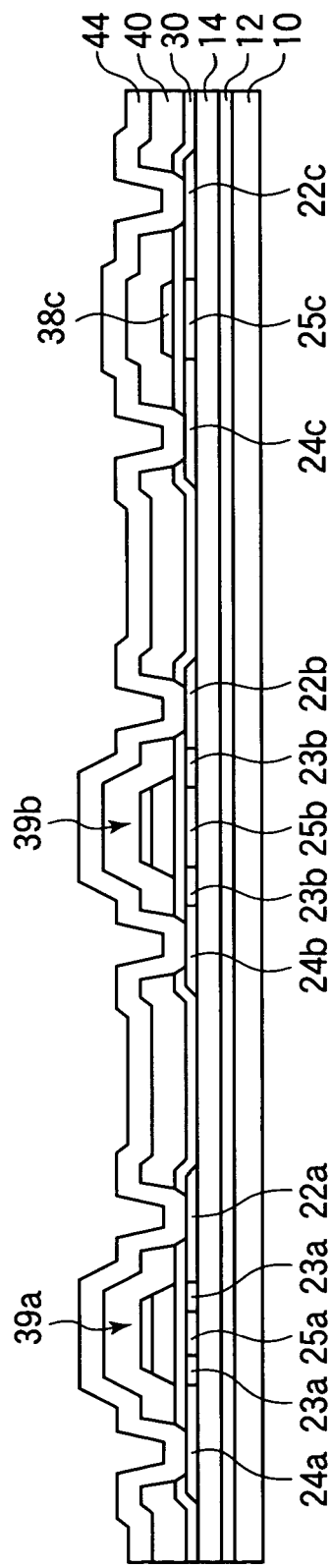
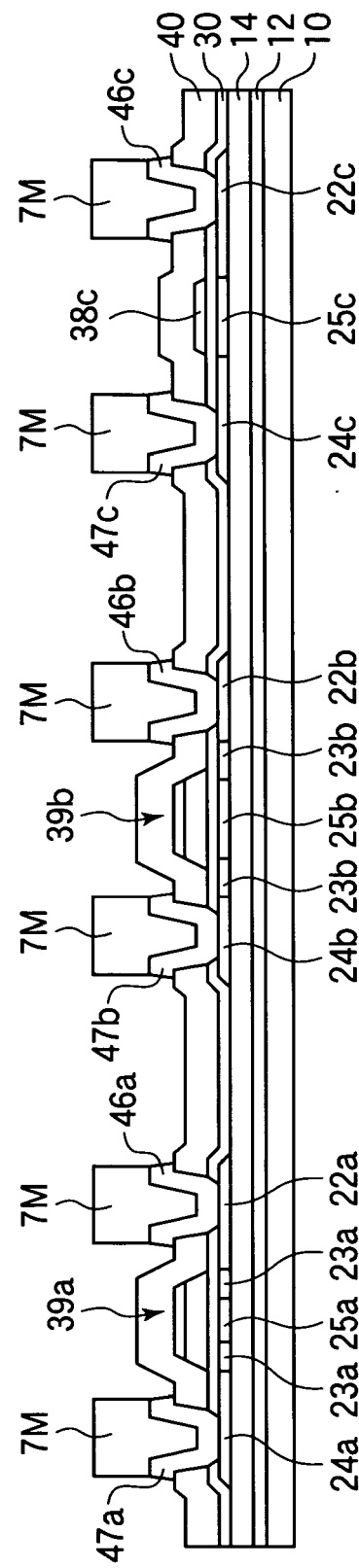
FIG.30A
FIG.30B

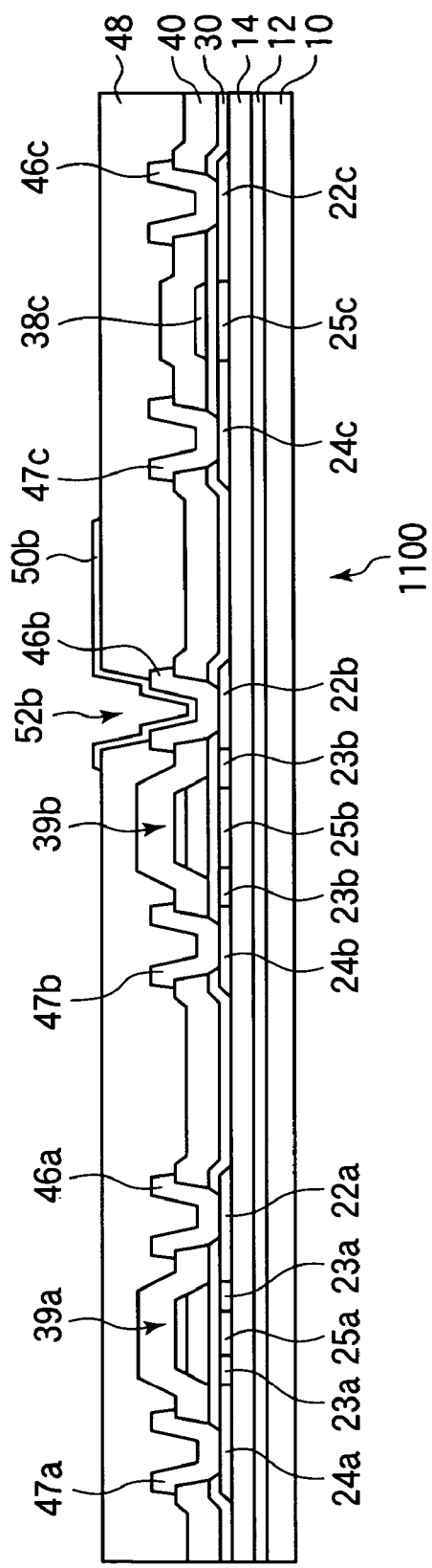

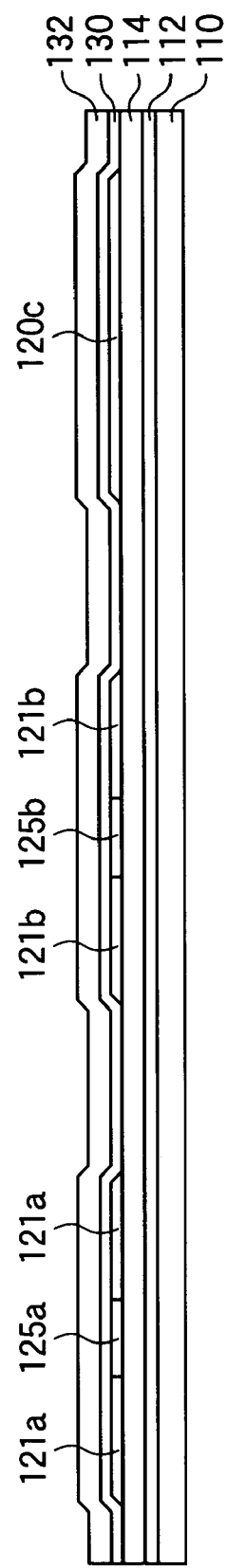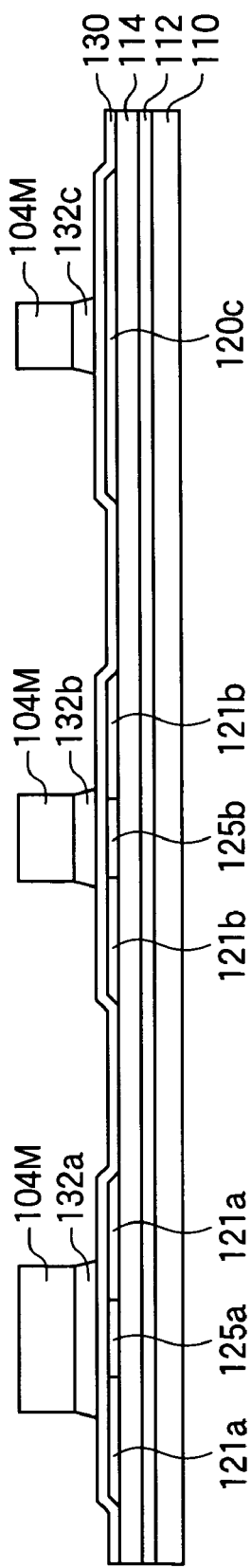
FIG.35A
FIG.35B

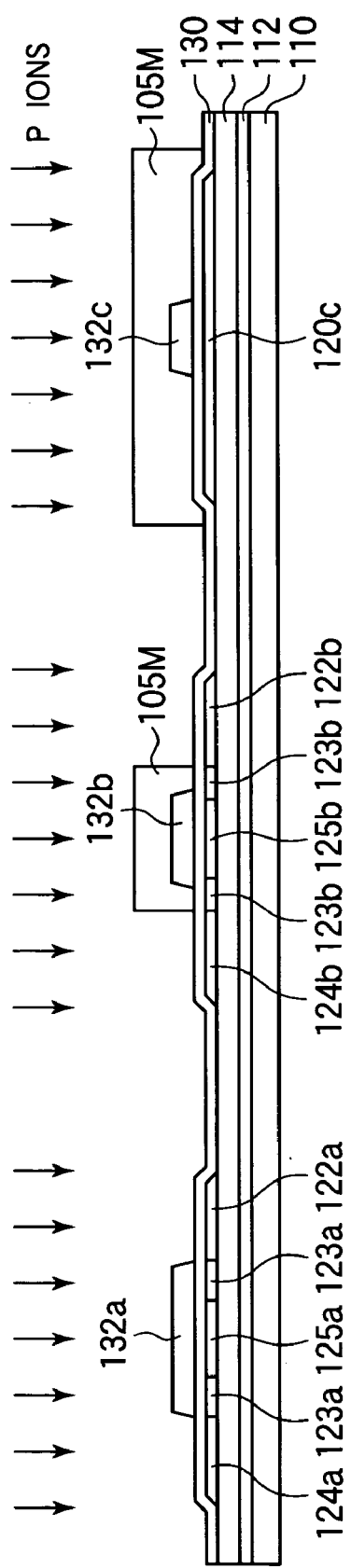

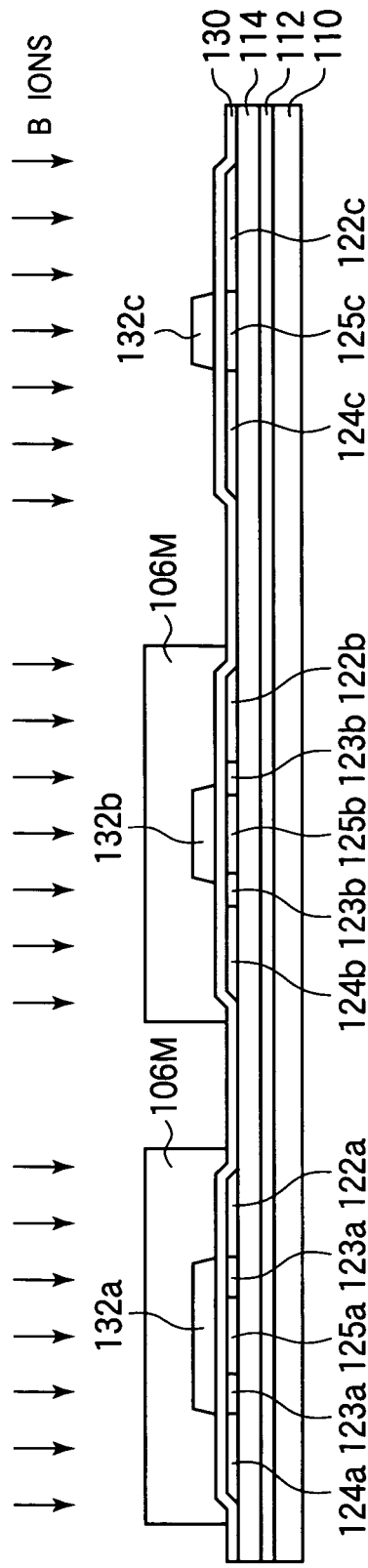
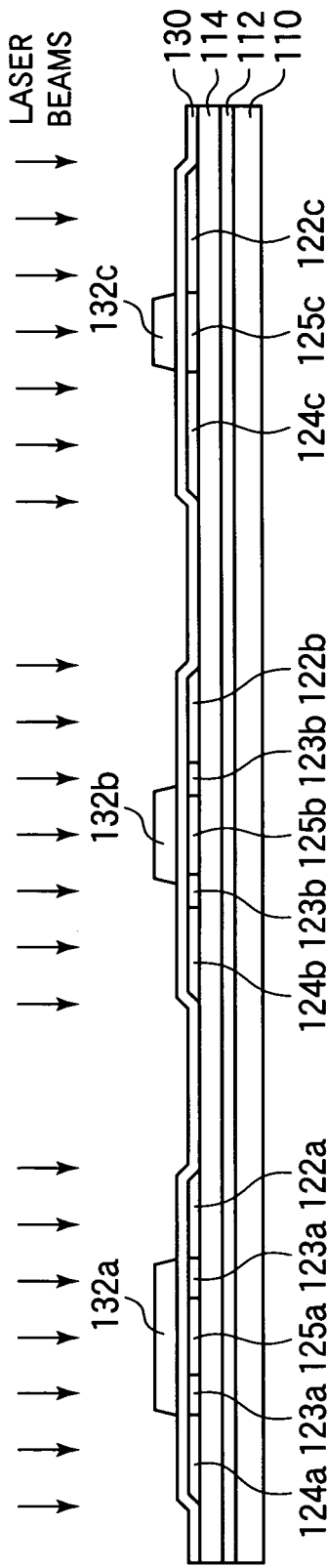

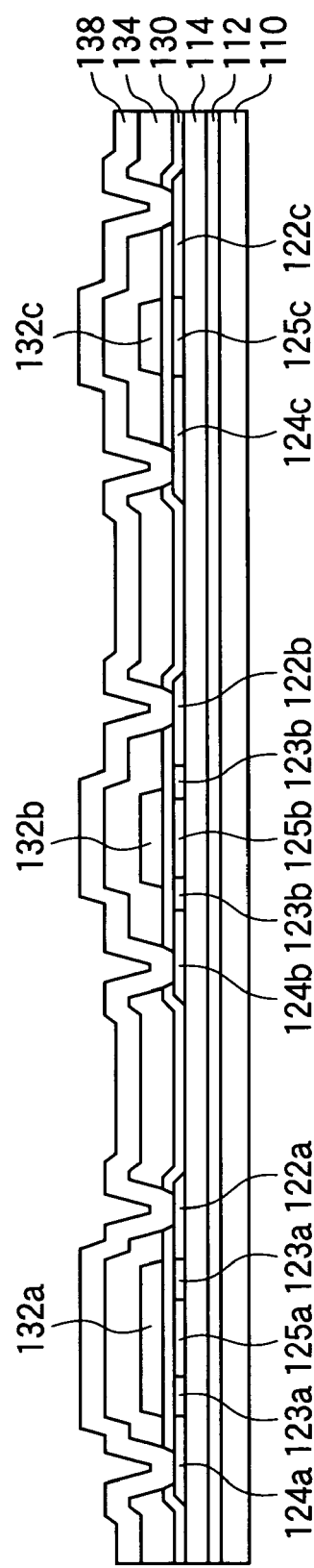
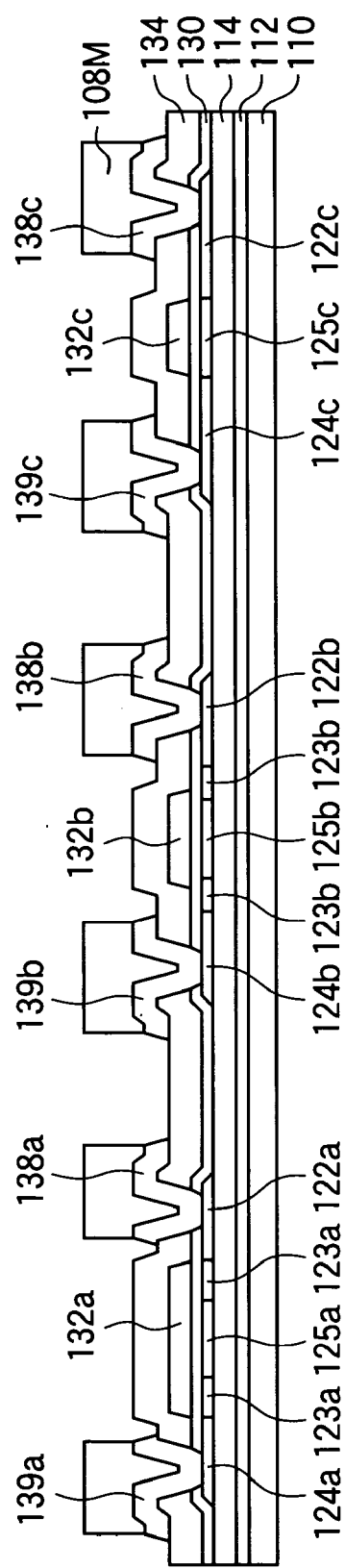
FIG.39A
FIG.39B

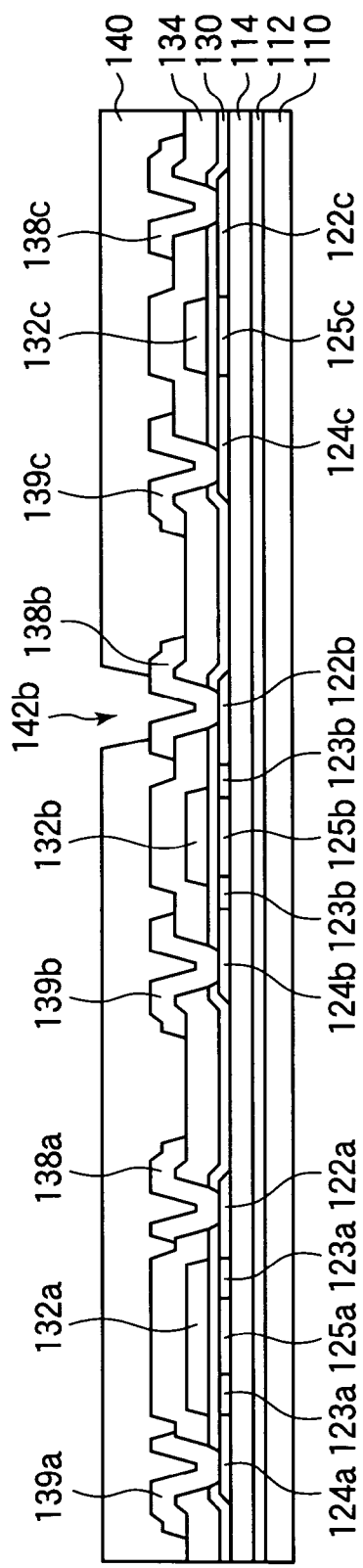

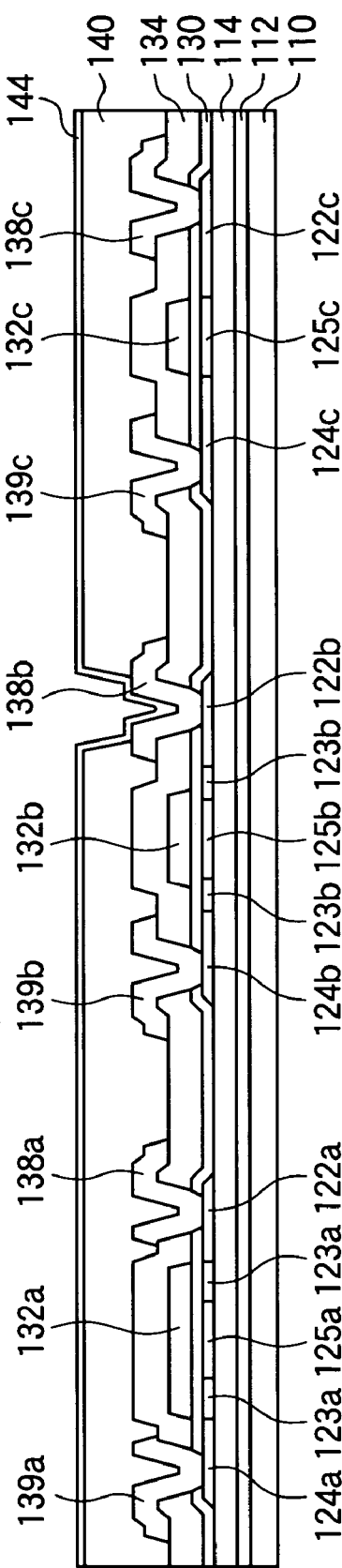
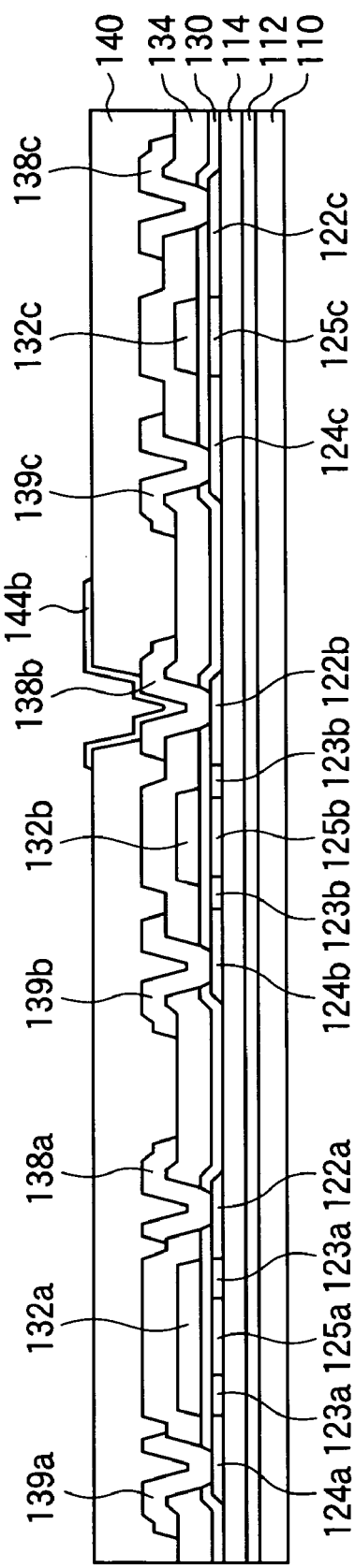
FIG.41A
FIG.41B

THIN-FILM TRANSISTOR DEVICE, UTILIZING DIFFERENT TYPES OF THIN FILM TRANSISTORS

BACKGROUND OF THE INVENTION

1. Field of the Invention

The present invention relates to a thin-film transistor device, a method of manufacturing the same, a thin-film transistor substrate provided therewith and a display device. More particularly, the invention relates to a thin-film transistor device having two kinds of polycrystalline silicon thin-film transistors of different types of electric conduction on the same substrate, a method of manufacturing the same, a thin-film transistor substrate provided therewith and a display device.

2. Description of the Related Art

Owing to its light weight, small thickness and low power consumption, a liquid crystal display device (LCD) has been used in wide field of applications such as finders of portable data terminals and video cameras and as display units of notebook PCs (personal computers). In order to decrease the cost, there has nowadays been widely used an LCD of the type of integrally forming the peripheral circuits of TFTs surrounding the display region while forming the thin-film transistors (TFTs) for driving the pixels in the display region. Polycrystalline silicon TFTs (p-Si TFTs) are used as the TFTs for driving pixels and as TFTs for the peripheral circuits in the LCD of the type of integrally forming the peripheral circuits.

The p-Si TFTs for driving the pixels must be fabricated in an LDD structure having a low density impurity implantation region (LDD—lightly doped drain region) formed among the channel region, a source region and a drain region to decrease the defective display caused by the leakage of current. The p-Si TFT for the peripheral circuit, on the other hand, is better not provided with the LDD region since provision of the LDD region results in a decrease in the operation speed and, besides, it is little affected by the leakage of current.

However, the n-ch TFT (TFT having n-type of electric conduction) without LDD region exhibits characteristics that are deteriorated due to hot carriers and, generally, exhibits lower reliability than that of the n-ch TFT having the LDD region. Through experiments conducted thus far, the present inventors have discovered that deterioration in the characteristics due to hot carriers can be decreased yet maintaining a sufficient operation speed of the TFTs upon employing a structure of providing the LDD region and covering the whole LDD region with the gate electrode (gate overlapping LDD structure, hereinafter referred to as GOLD structure). Concerning the TFT for driving the pixel, if there is employed a structure further provided with a conventional LDD region that is not covered with the gate electrode (hereinafter referred to as "partial GOLD structure") in addition to the GOLD structure, then, the off current can be decreased while achieving a high reliability. In the TFT of the GOLD structure, the LDD region as a whole is covered with the gate electrode while in the TFT of the partial GOLD structure, a portion neighboring the channel region in the LDD structure is covered with the gate electrode but other portions are not covered with the gate electrode.

Table 1 shows in comparison the characteristics and reliability of n-ch TFTs depending upon differences in the structure.

TABLE 1

|  | TFT1 | TFT2 | TFT3 | TFT4 |
| --- | --- | --- | --- | --- |
| Type of conduction | n-type | n-type | n-type | n-type |
| LDD structure | x | o | x | x |
| GOLD structure | x | x | o | x |
| Partial GOLD structure | x | x | x | o |
| On-current | oo | o | oo | o |
| Off-current | o | oo | o | oo |
| Hot-carrier deterioration | x | x | o | o |
| High-speed circuit | x | x | oo | o |
| Pixel | x | x | x | o |

In Table 1, TFT1 represents an n-ch TFT of the non-LDD structure and of the non-GOLD structure, TFT2 represents an n-ch TFT of the LDD structure and of the non-GOLD structure, TFT3 represents an n-ch TFT of the GOLD structure and TFT4 represents an n-ch TFT of the partial GOLD structure. As shown in Table 1, the TFT3 of the GOLD structure and the TFT4 of the partial GOLD structure exhibit less deterioration due to hot carriers and higher reliability than those of the TFT1 and TFT2 of the non-GOLD structure. When the TFT3 is compared with the TFT4, the TFT3 is suited for the high-speed circuit (peripheral circuit) on account of its large on-current, but is not suited for driving the pixel due to its large off-current. The TFT4, on the other hand, has a slightly small on-current and a small off-current, and is suited for driving the pixel. The p-ch TFT (TFT having p-type of electric conduction) exhibits characteristics that are not almost deteriorated by hot carriers and needs not have the LDD region.

To lower the consumption of electric power, it is desired that the peripheral circuits are constituted by CMOS circuits. When the CMOS circuits are used, it is important to control the threshold value of the TFTs. In general, the p-Si TFT has a threshold voltage of a negative sign (smaller than 0 V). Therefore, the channel region must be doped with impurities of the p-type such as boron (B) at a low concentration (hereinafter also referred to as "channel doping"). The n-ch TFT and the p-ch TFT exhibit threshold voltages that are shifted in different amounts for the amount of boron with which they are doped. Therefore, to maintain a sufficient difference in the threshold value between the n-ch TFT and the p-ch TFT, the boron concentration in the channel region of the n-ch TFT should be set to be slightly higher than the boron concentration in the channel region of the p-ch TFT.

A method of manufacturing a conventional p-Si TFT substrate having an n-ch TFT of the partial GOLD structure (TFT for driving pixel), an n-ch TFT of the GOLD structure and a p-ch TFT (TFT for peripheral circuit) without LDD region will now be described with reference to FIGS. 32A to 41B. FIGS. 32A and 41B are sectional views of steps illustrating a conventional method of manufacturing the p-Si TFT. In FIGS. 32A to 41B, the region for forming the n-ch TFT (hereinafter also referred to as "first TFT") of the GOLD structure is illustrated on the left side in the drawings, the region for forming the n-ch TFT (hereinafter also referred to as "second TFT") of the partial GOLD structure is illustrated in the central portion of the drawings, and the region for forming the p-ch TFT (hereinafter also referred to as "third TFT") is illustrated on the right side in the drawings.

Referring, first, to FIG. 32A, a silicon nitride film (SiN film) 112, a silicon oxide film ($SiO_2$ film) 114 and an amorphous silicon (a-Si) film are formed on the whole surface of the glass substrate 110 in this order. Then, the whole surface of the a-Si film is channel-doped with boron (B ions) and, then, the a-Si film is laser-crystallized by using an excimer laser to form a p-Si film 120. Referring next to FIG. 32B, a resist is applied onto the whole surface of the substrate followed by patterning by using the first photomask to thereby form a resist pattern 101M. The resist pattern 101M is so formed as to cover the whole region for forming the third TFT. Then, by using the resist pattern 101M as a mask, the p-Si film 120 is additionally channel-doped with boron except the region for forming the third TFT. Then, the boron concentration in the channel region of the n-ch TFTs (first and second TFTs) becomes slightly higher than the boron concentration in the channel region of the p-ch TFT (third TFT).

Referring next to FIG. 33, a resist is applied to the whole surface of the substrate and is patterned by using a second photomask to form resist patterns 102M. The resist patterns 102M are so formed as to cover the whole regions for forming the first to third TFTs. Then, the p-Si film 120 is etched by using the resist patterns 102M as masks to form island-like p-Si films 120*a*, 120*b* and 120*c*.

Referring next to FIG. 34, the resist is applied to the whole surface of the substrate and is patterned by using a third photomask to form resist patterns 103M. The resist patterns 103M are so formed as to cover a region that becomes the channel region of the first TFT, a region that becomes the channel region of the second TFT and the region for forming the third TFT. Then, by using the resist patterns 103M as masks, n-type impurities such as of phosphorus (P) are implanted at a low concentration. Then, n-type impurities are implanted into the p-Si film 121*a* on the region for forming the first TFT except the channel region 125*a* and into the p-Si film 121*b* in the region for forming the second TFT except the channel region 125*b*.

Referring next to FIG. 35A, an insulating film (gate insulating film) 130 and a first electrically conducting thin film 132 that serves as a gate electrode are formed in this order on the whole surface of the substrate on the p-Si films 121*a*, 125*a*, 121*b*, 125*b* and 120*c*. Referring next to FIG. 35B, the resist is applied to the whole surface of the substrate and is patterned by using a fourth photomask to form resist patterns 104M. The resist patterns 104M are so formed as to cover the channel region 125*a* of the first TFT and the p-Si film 121*a* of the region that becomes the LDD region, the channel region 125*b* of the second TFT and the p-Si film 121*b* of the region (GOLD region) covered with the gate electrode of the LDD region, and the region that becomes the channel region of the third TFT. Then, by using the resist patterns 104M as masks, the electrically conducting thin film 132 is etched to form the gate electrodes 132*a* 132*b* and 132*c*.

Referring next to FIG. 36, the resist is applied to the whole surface of the substrate and is patterned by using a fifth photomask to form resist patterns 105M. The resist patterns 105M are so formed as to cover the channel region 125*b* of the second TFT and the region that becomes the LDD region 123*b*, and the region where the third TFT is formed. Then, by using the resist patterns 105M and the gate electrode 132*a* as masks, n-type impurities such as of phosphorus are implanted at a high concentration. Then, there are formed a source region 122*a* and a drain region 124*a* of the first TFT, and a source region 122*b* and a drain region 124*b* of the second TFT.

Referring next to FIG. 37A, the resist is applied to the whole surface of the substrate and is patterned by using a sixth photomask to form resist patterns 106M. The resist patterns 106M are so formed as to cover the whole regions for forming the first and second TFTs. Then, by using the resist patterns 106M and the gate electrode 132*c* as masks, p-type impurities such as of boron are implanted at a high concentration. Then, a source region 122*c* and a drain region 124*c* are formed in the regions of the p-Si film 121*c* of the third TFT except the channel region 125*c* just under the gate electrode 132*c*. Next, the resist patterns 106M are peeled off, and the implanted impurities are activated by the irradiation with an excimer laser as illustrated in FIG. 37B.

Referring next to FIG. 38A, a first interlayer insulating film 134 is formed on the whole surface of the substrate on the gate electrodes 132*a*, 132*b* and 132*c*. Referring next to FIG. 38B, a resist is applied onto the whole surface of the substrate, and is patterned by using a seventh photomask to form resist patterns 107M. Then, by using the resist patterns 107M as masks, the interlayer insulating film 134 and the insulating film 130 are etched on the source regions 122*a*, 122*b*, 122*c* and on the drain regions 124*a*, 124*b*, 124*c* to form contact holes 136*a*, 136*b* and 136*c*.

Referring next to FIG. 39A, a second electrically conducting thin film 138 that serves as source/drain electrodes is formed on the whole surface of the substrate on the first interlayer insulating film 134. Referring next to FIG. 39B, a resist is applied to the whole surface of the substrate and is patterned by using an eighth photomask to form resist patterns 108M. Then, by using the resist patterns 108M as masks, the electrically conducting thin film 138 is etched to form source electrodes 138*a*, 138*b*, 138*c* and drain electrodes 139*a*, 139*b*, 139*c*. Through the above steps, there are formed an n-ch TFT (first TFT) of the GOLD structure illustrated on the left side in FIG. 39B, an n-ch TFT (second TFT) of the partial GOLD structure illustrated in the central portion of FIG. 39B and a p-ch TFT (third TFT) without LDD region illustrated on the right side in FIG. 39B.

Referring next to FIG. 40, a second interlayer insulating film 140 is formed on the whole surface of the substrate on the source electrodes 138*a*, 138*b* and 138*c*, and on the drain electrodes 139*a*, 139*b* and 139*c*. Then, by using a ninth photomask, the interlayer insulating film 140 is removed by etching on the source electrode 138*b* of the second TFT which is for driving the pixel to form a contact hole 142*b*.

Referring next to FIG. 41A, a third transparent electrically conducting film 144 that serves as pixel electrodes is formed on the whole substrate on the interlayer insulating film 140. Referring next to FIG. 41B, the electrically conducting film 144 is patterned by using a tenth photomask to form a pixel electrode 144*b*. Through the above steps, there is completed a p-Si TFT substrate including the n-ch TFT (TFT for driving the pixel) of the partial GOLD structure illustrated in the central portion of FIG. 41A, and n-ch TFT of the GOLD structure and p-ch TFT (TFT for peripheral circuit) without LDD region illustrated on the left side and on the right side in FIG. 41A.

When the n-ch TFTs of the GOLD structure and of the partial GOLD structure are formed as described above, it is not allowed to use the gate electrodes 132*a* and 132*b* as masks at the time of implanting n-type impurities at a low concentration into the p-Si films 121*a* and 121*b* except the channel regions 125*a*, 125*b*. Therefore, a step is newly required for forming the resist patterns 103M (see FIG. 34). Therefore, to form the CMOS circuits using the TFTs of the GOLD structure and of the partial GOLD structure, the step of photolithography is increased by at least one time as compared to when the TFTs of the non-GOLD structure are only used. To form the TFTs, therefore, eight or more times of photolithography steps are required. To manufacture the TFT substrate including the pixel electrode 144*b*, therefore, ten or more times of photo lithography steps are necessary resulting in a drop in the productivity of the TFT substrate and driving up the cost of manufacturing the TFT substrate.

Incidentally, the documents of the related art are as follows:

[Patent Document 1]
JP-A-2000-294787

[Patent Document 2]
JP-A-2001-13524

SUMMARY OF THE INVENTION

It is an object of this invention to provide a thin-film transistor device, a method of manufacturing the same, a thin-film transistor substrate equipped therewith, and a display device, which can be manufactured through a decreased number of photolithography steps, contribute to enhancing the productivity and help decrease the cost of production.

The above object is accomplished by a method of manufacturing a thin-film transistor device including, formed on a same substrate, a first thin-film transistor of n-type of electric conduction having a channel region and a low-concentration impurity region which is nearly entirely covered by a gate electrode, a second thin-film transistor of the n-type of electric conduction having a channel region and a low-concentration impurity region which is partially covered by the gate electrode, and a third thin-film transistor of p-type of electric conduction, the method comprising the steps of:

forming a semiconductor layer containing p-type impurities at a low concentration on the substrate;

forming an insulating film on the semiconductor layer;

forming a first electrically conducting thin film of a predetermined shape on the insulating film;

implanting p-type impurities at a low concentration into the semiconductor layer of a region where the first and second thin-film transistors are to be formed using the first electrically conducting thin film as a mask;

forming first resist patterns of a predetermined shape on the insulating film;

forming low-concentration impurity regions and source/drain regions of the first and second thin-film transistors by implanting n-type impurities into the semiconductor layers of the regions for forming the first and second thin-film transistors by using the first electrically conducting thin film and the first resist pattern as masks;

forming second electrically conducting thin films of predetermined shapes on the first electrically conducting thin film and on the insulating film, and forming a gate electrode of the first thin-film transistor on the insulating film;

further implanting n-type impurities into the source/drain regions of the first and second thin-film transistors by using the first and second electrically conducting thin films and the gate electrode of the first thin-film transistor as masks;

forming a gate electrode of the third thin-film transistor by etching the first electrically conducting thin film by using the second electrically conducting thin film as a mask;

forming second resist patterns of a predetermined shape on the second electrically conducting thin film;

forming source/drain regions of the third thin-film transistor by implanting p-type impurities into the semiconductor layer in the region for forming the third thin-film transistor by using the second electrically conducting thin films as a mask; and forming a gate electrode of the second thin-film transistor by etching the second electrically conducting thin films by using the second resist patterns as a mask.

The invention makes it possible to decrease the number of the photolithography steps, to improve the productivity and to decrease the cost of production.

BRIEF DESCRIPTION OF THE DRAWINGS

FIGS. 3A to 3C are sectional views of steps illustrating the TFT substrate according to the first embodiment of the invention and the method of manufacturing the TFT substrate;

FIG. 4 is a sectional view of a step illustrating the TFT substrate according to the first embodiment of the invention and the method of manufacturing the TFT substrate;

FIGS. 5A to 5D are sectional views of steps illustrating the TFT substrate according to the first embodiment of the invention and the method of manufacturing the TFT substrate;

FIGS. 6A to 6C are sectional views of steps illustrating the TFT substrate according to the first embodiment of the invention and the method of manufacturing the TFT substrate;

FIGS. 7A and 7B are sectional views of steps illustrating the TFT substrate according to the first embodiment of the invention and the method of manufacturing the TFT substrate;

FIGS. 10A to 10C are sectional views of steps illustrating the TFT substrate according to a second embodiment of the invention and the method of manufacturing the TFT substrate;

FIG. 12 is a sectional view of a step illustrating the TFT substrate according to the second embodiment of the invention and the method of manufacturing the TFT substrate;

FIGS. 15A to 15C are sectional views of steps illustrating the TFT substrate according to the third embodiment of the invention and the method of manufacturing the TFT substrate;

FIGS. 16A to 16D are sectional views of steps illustrating the TFT substrate according to the third embodiment of the invention and the method of manufacturing the TFT substrate;

FIGS. 17A to 17C are sectional views of steps illustrating the TFT substrate according to the third embodiment of the invention and the method of manufacturing the TFT substrate;

FIGS. 18A and 18B are sectional views of steps illustrating the TFT substrate according to the third embodiment of the invention and the method of manufacturing the TFT substrate;

FIGS. 21A and 21C are sectional views of steps illustrating the TFT substrate according to a fourth embodiment of the invention and the method of manufacturing the TFT substrate;

FIGS. 24A and 24B are sectional views of steps illustrating the TFT substrate according to a fifth embodiment of the invention and the method of manufacturing the TFT substrate;

FIGS. 27A to 27D are sectional views of steps illustrating the TFT substrate according to the fifth embodiment of the invention and the method of manufacturing the TFT substrate;

FIGS. 28A and 28B are sectional views of steps illustrating the TFT substrate according to the fifth embodiment of the invention and the method of manufacturing the TFT substrate;

FIGS. 30A and 30B are sectional views of steps illustrating the TFT substrate according to the fifth embodiment of the invention and the method of manufacturing the TFT substrate;

FIG. 31 is a sectional view of a step illustrating the TFT substrate according to the fifth embodiment of the invention and the method of manufacturing the TFT substrate;

FIGS. 35A and 35B are sectional views of steps illustrating the conventional method of manufacturing the p-Si TFT substrate;

FIG. 36 is a sectional view of a step illustrating the conventional method of manufacturing the p-Si TFT substrate;

FIGS. 37A and 37B are sectional views of steps illustrating the conventional method of manufacturing the p-Si TFT substrate;

FIGS. 39A and 39B are sectional views of steps illustrating the conventional method of manufacturing the p-Si TFT substrate;

FIG. 40 is a sectional view of a step illustrating the conventional method of manufacturing the p-Si TFT substrate; and FIGS. 41A and 41B are sectional views of steps illustrating the conventional method of manufacturing the p-Si TFT substrate;

DESCRIPTION OF THE PREFERRED EMBODIMENTS

Figure 1:
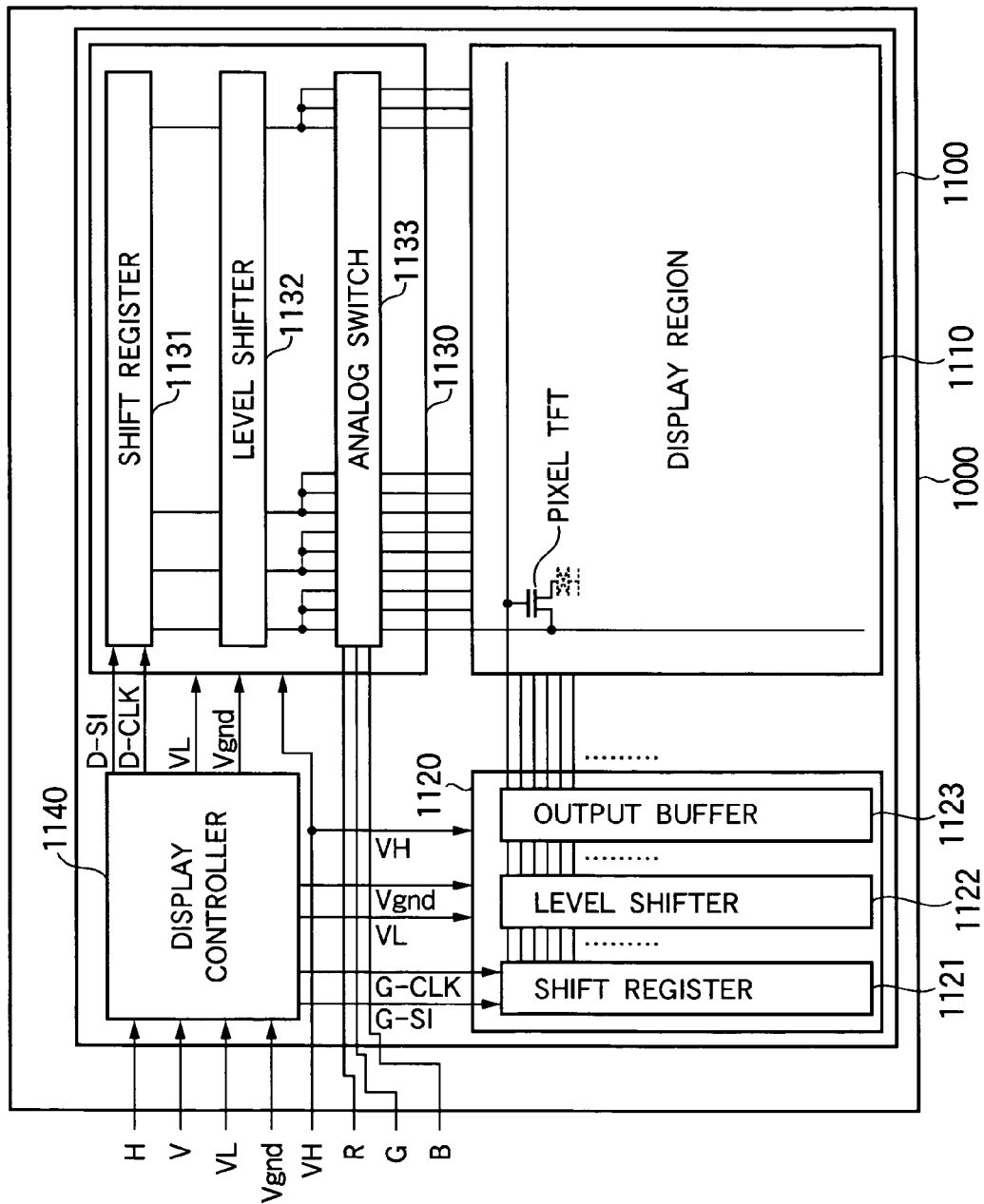
FIG. 1 is a view illustrating the constitution of a display device according to a first embodiment of the invention.

A thin-film transistor device, a method of manufacturing the same, a thin-film transistor substrate provided therewith and a display device according to a first embodiment of the invention will now be described with reference to FIGS. 1 to 9. FIG. 1 illustrates the constitution of a liquid crystal display device which is the display device according to the embodiment. The liquid crystal display device 1000 according to the embodiment includes a TFT substrate 1100, an opposing substrate (not shown) arranged facing the TFT substrate 1100 and liquid crystals sealed between the two substrates. The TFT substrate 1100 includes a display region 1110 where the pixel regions are arranged like a matrix, a gate driver 1120, a display controller 1140 and a data driver 1130 which are peripheral circuits. In the display region 1110, there are formed a plurality of TFTs (pixel TFTs) for driving pixels for each of the pixel regions. The TFTs for pixels are connected to the data driver 1130 through drain bus lines connected to the source electrodes of the TFTs for driving pixels, and are connected the gate driver 1120 through gate bus lines connected to the gate electrodes of the TFTs for driving pixels.

The display controller 1140 is supplied with horizontal synchronizing signals H, vertical synchronizing signals V, a low power source voltage VL and ground voltage Vgnd from, for example, PC (not shown). By using the signals that are fed, the display controller 1140 forms a D-SI signal and a D-CLK signal, and sends them to a shift register 1131 in the data driver 1130. The low power source voltage VL and ground voltage Vgnd, too, are fed to the data driver 1130. The data driver 1130 is further served with a high power source voltage VH. The shift register 1131 in the data driver 1130 sends the formed signal to a level shifter 1132. An analog switch 1133 in the data driver 1130 receives signals of red (R), green (G) and blue (B) from, for example, PC. Based on the signals from the level shifter 1132, the analog switch 1133 sends predetermined data signals to the drain bus lines connected to the TFTs for driving pixels in the display region 1110.

By using the signals that are fed, the display controller 1140 forms a G-SI signal and a G-CLK signal, and sends them to a shift register 1121 in the gate driver 1120. The low power source voltage VL and ground voltage Vgnd, too, are fed to the gate driver 1120. A high power source voltage VH, too, is fed to the gate drier 1120. The shift register 1121 in the gate driver 1120 sends the formed signals to the level shifter 1122. Based upon the signals that are input, the level shifter 1122 sends signals to an output buffer 1123. In response to the signals that are input, the output buffer 1123 successively sends scanning signals to the gate bus lines connected to the TFTs for driving pixels in the display region 1110.

Next, the thin-film transistor device of the present embodiment, the thin-film transistor substrate provided therewith, and the method of manufacturing the same will be described with reference to FIGS. 2A to 9. FIGS. 2A to 9 are sectional views of steps illustrating the TFT substrate and the method of manufacturing the TFT substrate according to the embodiment. In FIGS. 2A to 9, a region for forming the n-ch TFT (first TFT) of the GOLD structure is illustrated on the left side of the drawings, a region for forming the n-ch TFT (second TFT) of the partial GOLD structure is illustrated at the central portion of the drawings, and a region for forming the p-ch TFT (third TFT) is illustrated on the right side of the drawings.

Figure 2A:
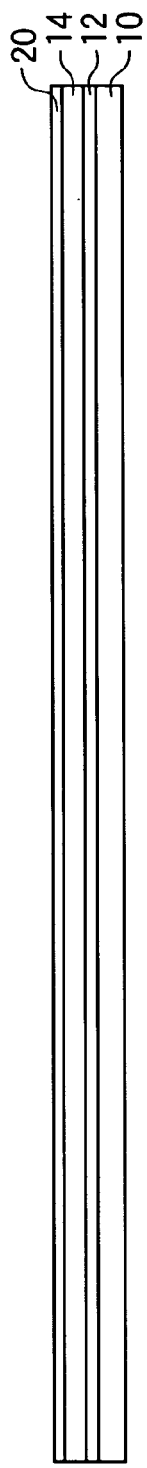
FIGS. 2A and 2B are sectional views of steps illustrating a TFT substrate according to the first embodiment of the invention and a method of manufacturing the TFT substrate.
Figure 2B:
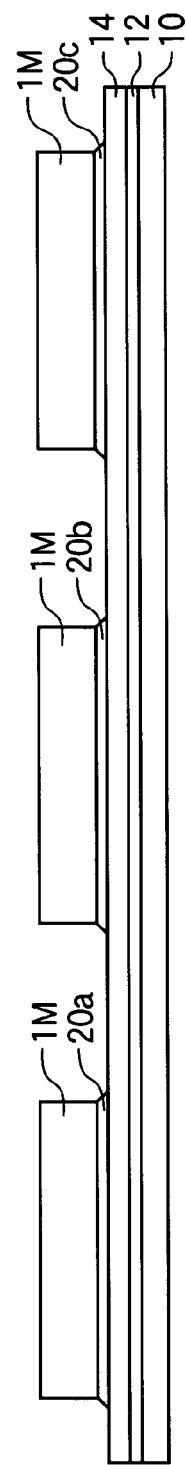

Referring, first, to FIG. 2A, for example, an underlying SiN film 12 having a thickness of 50 nm, for example, an underlying $SiO_2$ film 14 having a thickness of 200 nm and for example, an a-Si film having a thickness of 40 nm are formed in this order on the whole surface of a transparent and electrically insulating glass substrate 10 by using a plasma CVD apparatus. Then, boron ions are implanted into the whole surface of the a-Si film (channel doping) by using an ion-doping apparatus. The boron ions are implanted with the acceleration energy of, for example, 10 keV and in a dose amount of $1\times10^{12}$ cm$^{-2}$. Thereafter, the a-Si film is laser-crystallized by using an excimer laser thereby to form a p-Si film 20. Referring next to FIG. 2B, a resist is applied to the whole surface of the substrate and is patterned by using a first photomask to form resist patterns 1M. The resist patterns 1M are so formed as to cover the whole regions for forming the first to third TFTs. Then, by using the resist patterns 1M as masks, the p-Si film 20 is dry-etched with a fluorine-type gas to form island-like p-Si films 20a, 20b and 20c. As a method of adding boron into the a-Si film, a $B_2H_6$ gas may be added in an amount of about several ppm to the $SiH_4$ gas stream at the time of forming the a-Si film. Or, the boron ions may be implanted into the p-Si film 20 (20a, 20b and 20c) by using the ion-doping apparatus after the crystallization with a laser or after etched like islands.

After the resist patterns 1M are peeled off, an insulating film 30 is formed as illustrated in FIG. 3A by forming an $SiO_2$ film of a thickness of, for example, 60 nm on the whole surface of the substrate on the p-Si films 20a, 20b and 20c by using a plasma CVD apparatus. The insulating film 30 works as a gate insulating film under the gate electrode of a completed TFT. Then, a first electrically conducting thin film 32 is formed by forming a molybdenum (Mo) film of a thickness of, for example, 200 nm by using a sputtering device. Next, the resist is applied onto the whole surface of the substrate as illustrated in FIG. 3B, and is patterned by using a second photomask to form a resist pattern 2M. The resist pattern 2M is so formed as to cover the whole region for forming the third TFT. Then, by using the resist pattern 2M as a mask, the electrically conducting thin film 32 is wet-etched to form an electrically conducting thin film 32c. After the resist pattern 2M is peeled off, the electrically conducting thin film 32c is used as a mask as shown in FIG. 3C to implant boron ions at a low concentration into the p-Si films 20a and 20b (additional channel doping) by using the ion-doping apparatus. The boron ions are implanted through the insulating film 30 with the acceleration energy of, for example, 40 keV and in a dose amount of $1\times10^{12}$ cm$^{-2}$. Then, the concentration of p-type impurities in the channel regions of the first and second TFTs becomes slightly higher than the concentration of p-type impurities in the channel region of the third TFT.

Referring, next, to FIG. 4, the resist is applied to the whole surface of the substrate and is patterned by using a third photomask to form resist patterns 3M. The resist patterns 3M are so formed as to cover the regions that become the channel regions of the first and second TFTs. Then, by using the resist patterns 3M and the electrically conducting thin film 32c as masks, the phosphorus ions are implanted at a low concentration into the p-Si films 20a and 20b by using the ion-doping apparatus. The phosphorus ions are implanted through the insulating film 30 with the acceleration energy of, for example, 40 keV and in a dose amount of $8\times10^{13}$ cm$^{-2}$. Then, phosphorus ions are implanted into the p-Si film 21a except the channel region 25a of the first TFT and into the p-Si film 21b except the channel region 25b of the second TFT.

Referring, next, to FIG. 5A, an Al—Ti film having a thickness of, for example, 300 nm is formed on the whole surface of the substrate on the first electrically conducting thin film 32c by using the sputtering apparatus to thereby form a second electrically conducting thin film 36. Then, referring to FIG. 5B, the resist is applied onto the whole surface of the substrate, and is patterned by using a fourth photomask to form resist patterns 4M. The resist patterns 4M are so formed as to cover a region that becomes the channel region and the LDD region of the first TFT, to cover a region that becomes the channel region and the LDD region of the second TFT and to cover a region that becomes the gate electrode of the third TFT. Then, by using the resist patterns 4M as masks, the electrically conducting thin film 36 which is the Al—Ti film is dry-etched with the chlorine-type gas thereby to form a gate electrode 37a and electrically conducting thin films 36b and 36c. Here, the first electrically conducting thin film 32c comprising the Mo film remains without being etched. The first TFT has the GOLD structure, and the gate electrode 37a is so formed as to cover the whole LDD region 23a. After the resist patterns 4M are peeled off, the phosphorus ions are implanted at a high concentration into the p-Si films 21a and 21b as illustrated in FIG. 5C by using the ion-doping apparatus and by using the gate electrode 37a, electrically conducting thin film 36b and electrically conducting thin film 32c as masks. The phosphorus ions are implanted through the insulating film 30 with the acceleration energy of, for example, 40 keV and in a dose amount of $2\times10^{15}$ cm$^{-2}$. Then, the phosphorus ions are implanted at a high concentration into a region of the p-Si film 21a of the first TFT except the LDD region 23a to thereby form a source region 22a and a drain region 24a. Further, the phosphorus ions are implanted at a high concentration into a region of the p-Si film 21b of the second TFT except the LDD region 23b to thereby form a source region 22b and a drain region 24b. Referring, next, to FIG. 5D, by using the second electrically conducting thin film 36c which is the Al—Ti film as a mask, the first electrically conducting thin film 32c which is the Mo film is dry-etched with the fluorine-type gas to thereby form a gate electrode 33c. After the second electrically conducting thin film 36 is etched, the phosphorus ions may be implanted and the first electrically conducting thin film 32c may be etched while leaving the resist patterns 4M without any problem.

Referring, next, to FIG. 6A, the resist is applied to the whole surface of the substrate and is patterned by using a fifth photomask to form resist patterns 5M. The resist patterns 5M are so formed as to cover the whole region that forms the first TFT and the region that becomes the gate electrode of the second TFT. Then, by using the resist patterns 5M and the electrically conducting thin films 36b, 36c as masks, the boron ions are implanted at a high concentration into the source region 22b, drain region 24b and p-Si film 20c by using the ion-doping apparatus. The boron ions are implanted through the insulating film 30 with the acceleration energy of, for example, 40 keV and in a dose amount of $1 \times 10^{15}$ cm$^{-2}$. Then, the boron ions are implanted at a high concentration into the p-Si film 20c of the third TFT except the channel region 25c to thereby form a source region 22c and a drain region 24c. Here, the boron ions are implanted into the source region 22b and the drain region 24b, too, of the second TFT. However, the dose amount of boron ions is about one-half the dose amount of phosphorus ions that have been implanted already, and the type of conduction is not inverted from the n-type into the p-type. Referring, next, to FIG. 6B, the resist patterns 5M are used as masks, and the electrically conducting thin films 36b and 36c comprising the Al—Ti film are dry-etched with the chlorine-type gas. The gate electrode 33c which is the Mo film is not removed by this etching but remains. Thus, the gate electrode 37b of the second TFT is formed while removing the electrically conducting thin film 36c on the gate electrode 33c of the third TFT. Here, the second TFT is of the partial GOLD structure and, hence, the gate electrode 37b is so formed as to cover portions of the channel region 25b and of the LDD region 23b. Referring, next, to FIG. 6C, the resist patterns 5M are peeled off by using an ashing apparatus, followed by the irradiation with the excimer laser to activate the implanted impurities. If both the first electrically conducting thin film 32 and the second electrically conducting thin film 36 are formed by using a high-melting metal or a semiconductor material, the impurities can be activated by the heat treatment in an annealing furnace.

Referring, next, to FIG. 7A, an SiN film of a thickness of, for example, 370 nm is formed on the whole surface of the substrate on the gate electrodes 37a, 37b and 37c by using a plasma CVD apparatus, thereby to form a first interlayer insulating film 40 containing hydrogen. The interlayer insulating film 40 is hydrogenated by annealing in a hydrogen atmosphere or by the treatment with a hydrogen plasma. Then, the heat treatment is conducted in a nitrogen atmosphere at 380° C. for two hours. Referring, next, to FIG. 7B, the resist is applied onto the whole surface of the substrate and is patterned by using a sixth photomask to form resist patterns 6M. Then, by using the resist patterns 6M as masks, the interlayer insulating film 40 and the insulating film 30 are dry-etched with the fluorine-type gas to form contact holes 42a on the source region 22a and on the drain region 24a, to form contact holes 42b on the source region 22b and on the drain region 24b, and to form contact holes 42c on the source region 22c and on the drain region 24c.

Figure 8:
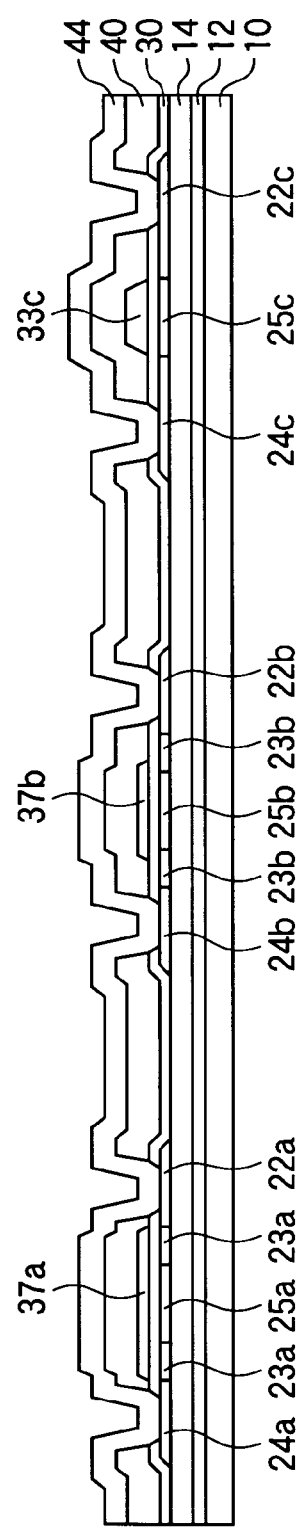
FIG. 8 is a sectional view of a step illustrating the TFT substrate according to the first embodiment of the invention and the method of manufacturing the TFT substrate.
Figure 9:
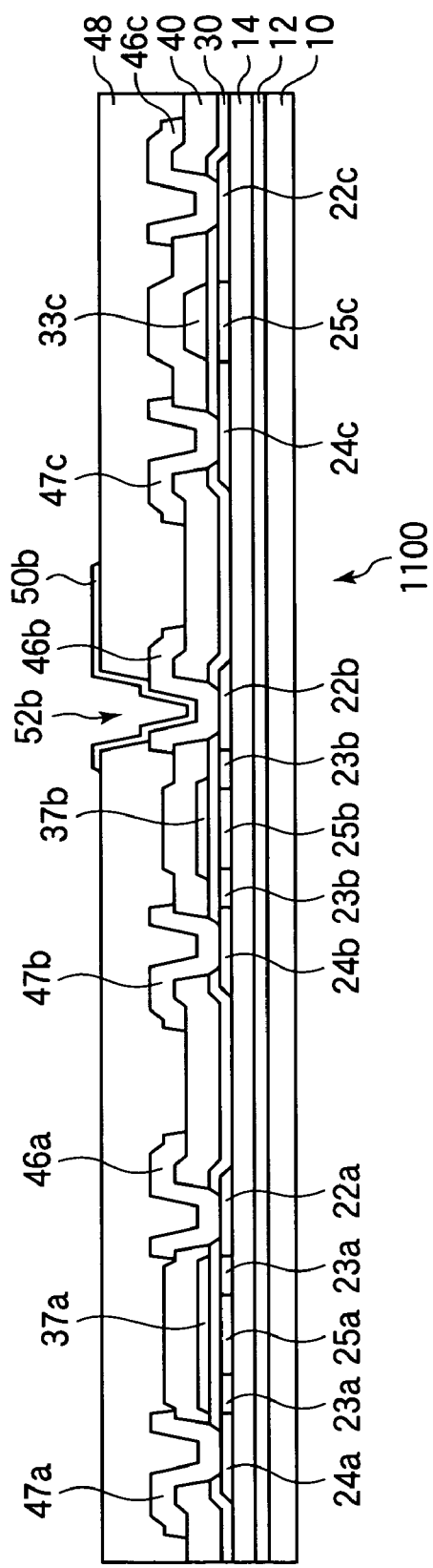
FIG. 9 is a sectional view of a step illustrating the TFT substrate according to the first embodiment of the invention and the method of manufacturing the TFT substrate.
Figure 11:
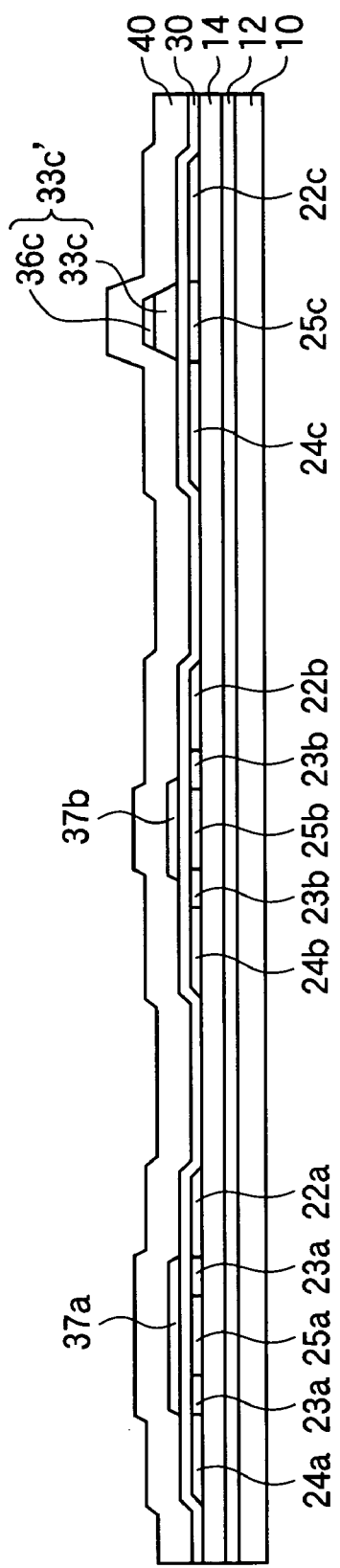
FIG. 11 is a sectional view of a step illustrating the TFT substrate according to the second embodiment of the invention and the method of manufacturing the TFT substrate.

After the resist patterns 6M are peeled off as illustrated in FIG. 8, a Ti film having a thickness of, for example, 100 nm, an Al film having a thickness of 200 nm and a Ti film having a thickness of 100 nm are formed in this order on the whole surface of the substrate on the interlayer insulating film 40 by using a sputtering apparatus, to thereby form a third electrically conducting thin film 44. Next, the resist is applied onto the whole surface of the substrate and is patterned by using a seventh photomask to form resist patterns (not illustrated). Then, by using the resist patterns as masks, the electrically conducting thin film 44 is dry-etched with the chlorine-type gas to form source electrodes 46a, 46b, 46c and drain electrodes 47a, 47b, 47c as shown in FIG. 9. The source electrodes 46a, 46b and 46c are connected to the source regions 22a, 22b and 22c. The drain electrodes 47a, 47b and 47c are connected to the drain regions 24a, 24b and 24c, respectively. Thereafter, the resist patterns are peeled off. Through the above steps, a TFT device according to the embodiment is completed including an n-ch TFT (first TFT) of the GOLD structure illustrated on the left side in FIG. 9, an n-ch TFT (second TFT) of the partial GOLD structure illustrated at the central portion in FIG. 9, and a p-ch TFT (third TFT) illustrated on the right side in FIG. 9.

Next, an SiN film having a thickness of, for example, 400 nm is formed on the whole surface of the substrate on the source electrodes 46a, 46b, 46c and on the drain electrodes 47a, 47b, 47c by using a plasma CVD apparatus, thereby to form a second interlayer insulating film 48. Next, the resist is applied onto the whole surface of the substrate and is patterned by using an eighth photomask to form resist patterns (not shown). Then, by using the resist patterns as masks, the interlayer insulating film 48 is dry-etched with the fluorine-type gas to form a contact hole 52b on the source electrode 46b. Next, an ITO film having a thickness of, for example, 70 nm is formed on the whole surface of the substrate on the interlayer insulating film 48 by using a sputtering device thereby to form a fourth electrically conducting thin film (not shown). Next, the resist is applied onto the whole surface of the substrate and is patterned by using a ninth photomask to form resist patterns (not shown). Then, by using the resist patterns as masks, the fourth electrically conducting thin film is etched by using an ITO etcher, thereby to form a pixel electrode 50b. Through the above steps, a TFT substrate 1100 is completed including an n-ch TFT (TFT for driving pixel)) of the GOLD structure illustrated at the central portion in FIG. 9, an n-ch TFT of the GOLD structure illustrated on the left side in FIG. 9 and a p-ch TFT (TFT for peripheral circuit) illustrated on the right side in FIG. 9.

In the TFT substrate 1100 formed by the method of manufacturing the TFT substrate according to the embodiment as illustrated in FIG. 9, different materials are used for forming the gate electrodes 37a, 37b of the first and second TFTs and for forming the gate electrode 33c of the third TFT. In the TFT substrate 1100 formed by the method of manufacturing the TFT substrate of the embodiment, further, p-type impurities are implanted at a low concentration into the channel regions 25a, 25b of the first and second TFTs and into the channel region 25c of the third TFT, the concentration of p-type impurities in the channel regions 25a and 25b of the first and second TFTs being higher than the concentration of p-type impurities in the channel region 25c of the third TFT.

In the method of manufacturing the TFT device and the TFT substrate according to the embodiment, use is made of two kinds of electrically conducting materials, an etching gas for selectively removing either one of the electrically conducting materials and a plurality of resist patterns used as masks for implanting impurities, thereby to form the gate electrodes of the first to third TFTs stepwise. Therefore, the photolithography step is effected seven times for forming the TFTs, and the photolithography step is effected nine times for manufacturing the TFT substrate 1100 including pixel electrodes 50b. As compared to the related art, therefore, the photolithography step can be decreased by at least one time, making it possible to improve the productivity of the TFT substrate 1100 and to decrease the cost of production. By effecting the photolithography step the number of times equal to the number of times for manufacturing the TFT substrate equipped with TFTs of the non-GOLD structure, further, it is made possible to manufacture the TFT substrate 1100 having n-ch TFTs of the GOLD structure featuring a high reliability.

Next, the thin-film transistor device, the thin-film transistor substrate provided therewith and the method of manufacturing the same according to a second embodiment of the invention will be described with reference to FIGS. 10A to 12. FIGS. 10A to 12 are sectional views of steps illustrating the TFT device and the method of manufacturing the TFT substrate according to this embodiment. In FIGS. 10A to 12, a region for forming an n-ch TFT (first TFT) of the GOLD structure is illustrated on the left side, a region for forming an n-ch TFT (second TFT) of the partial GOLD structure is illustrated at the central portion, and a region for forming a p-ch TFT (third TFT) is illustrated on the right side in the drawing. In the method of manufacturing the TFT device according to this embodiment, the steps of up to forming the gate electrode of the third TFT (lower layer of the gate electrode 33*c'* in this embodiment) are the same as those of the first embodiment illustrated in FIGS. 2A to 5D, and are not described here again. In this embodiment, the electrically conducting thin film 36*c* is not removed but is used as an upper layer of the gate electrode 33*c'*.

Referring to FIG. 10A, boron ions are implanted at a high concentration into the source regions 22*a*, 22*b*, into the drain regions 24*a*, 24*b* and into the p-Si film 20*c* (see FIG. 5D) by using the ion-doping apparatus with the gate electrode 37*a* and electrically conducting thin films 36*b*, 36*c* as masks. The boron ions are implanted through the insulating film 30 with the acceleration energy of, for example, 40 keV and in a dose amount of $1 \times 10^{15}$ cm$^{-2}$. Then, the boron ions are implanted at a high concentration into the p-Si film 20*c* of the third TFT except the channel region 25*c* to thereby form the source region 22*c* and the drain region 24*c*. Referring, next, to FIG. 10B, the resist is applied to the whole surface of the substrate and is patterned by using the fifth photomask to form resist patterns 5M. The resist patterns 5M are formed on the whole region for forming the first TFT, on the region that becomes the gate electrode of the second TFT and the whole region for forming the third TFT. Next, by using the resist patterns 5M as masks, the electrically conducting thin film 36*b* is dry-etched with the chlorine-type gas to form the gate electrode 37*b* of the second TFT. Here, the second TFT is of the partial GOLD structure and, hence, the gate electrode 37*b* is so formed as to partially cover the channel region 25*b* and the LDD region 23*b*. Referring next to FIG. 10C, the resist patterns 5M are peeled off by using the ashing device, followed by the irradiation with the excimer laser to activate the implanted impurities.

Thereafter, like in the first embodiment, a first interlayer insulating film 40 is formed (see FIG. 11) on the whole surface of the substrate on the gate electrodes 37*a*, 37*b*, 33*c'*. Referring next to FIG. 12, the interlayer insulating film 40 and the insulating film 30 are patterned by using the sixth photomask to form contact holes 42*a*, 42*b* and 42*c*. Next, an electrically conducting thin film 44 is formed on the whole surface of the substrate on the interlayer insulating film 40. Then, the electrically conducting thin film 44 is patterned by using the seventh photomask to form the source electrodes 46*a*, 46*b*, 46*c* and the drain electrodes 47*a*, 47*b*, 47*c* (not shown). Then, a second interlayer insulating film is formed on the whole surface of the substrate on the source electrodes 46*a*, 46*b*, 46*c* and on the drain electrodes 47*a*, 47*b*, 47*c*. Next, the second interlayer insulating film is patterned by using the eighth photomask to form contact holes on the source electrode 46*b*. Next, a fourth electrically conducting thin film is formed on the whole surface of the substrate on the second interlayer insulating film and is patterned by using a ninth photomask to form a pixel electrode. Through the above steps, there is completed a TFT substrate 1100 including an n-ch TFT (TFT for driving pixel) of the partial GOLD structure, an n-ch TFT of the GOLD structure and a p-ch TFT (TFT for peripheral circuit).

In the TFT substrate 1100 formed by the method of manufacturing the TFT substrate of this embodiment as shown in FIG. 12, the gate electrodes 37*a* and 37*b* of the first and second TFTs and the gate electrode 33*c'* of the third TFT are formed in different structures. Namely, the gate electrodes 37*a* and 37*b* are constituted by a single layer of the second electrically conducting thin film, and the gate electrode 33*c* is constituted by a laminate of the first and second electrically conducting thin films. Here, the resist masks 5M may have the same shape as that of the first embodiment. In this case, the gate electrode 33*c'* (33*c*) of the third TFT is constituted by a single layer which is the first electrically conducting thin film. In the TFT substrate 1100 formed by using the method of manufacturing the TFT substrate of this embodiment, the p-type impurities are implanted at a low concentration into the channel regions 25*a*, 25*b* of the first and second TFTs and into the channel region 25*c* of the third TFT, the concentration of the p-type impurities in the channel regions 25*a*, 25*b* of the first and second TFTs being higher than the concentration of p-type impurities in the channel region 25*c* of the third TFT.

The method of manufacturing the TFT device and the TFT substrate of this embodiment is the same as that of the first embodiment with the exception of implanting the p-type impurities at a high concentration by using the gate electrode 37*a* and the second electrically conducting thin films 36*b*, 36*c* as masks and, then, forming the resist patterns 5M, and partially etching the electrically conducting thin film 36*b* of the second TFT with the resist patterns 5M as masks. According to the method of manufacturing the TFT device and the TFT substrate of this embodiment, the photolithography step is effected seven times for forming the TFT and the photolithography step is effected nine times for manufacturing the TFT substrate 1100 including pixel electrodes 50*b* like in the first embodiment. Therefore, the photolithography step can be decreased by at least one time as compared to the related art to improve the productivity of the TFT substrate 1100 and to decrease the cost of production. Through the photolithography step effected the same number of times as for the TFT substrate equipped with TFTs of the non-GOLD structure, further, there is manufactured the TFT substrate 1100 having the n-ch TFTs of the GOLD structure maintaining high reliability.

Next, the thin-film transistor device, the thin-film transistor substrate provided therewith and the method of manufacturing the same according to a third embodiment of the invention will be described with reference to FIGS. 13A to 20. FIGS. 13A to 20 are sectional views of steps illustrating the TFT device and the method of manufacturing the TFT substrate according to this embodiment. In FIGS. 13A to 20, a region for forming an n-ch TFT (first TFT) of the GOLD structure is illustrated on the left side, a region for forming an n-ch TFT (second TFT) of the partial GOLD structure is illustrated at the central portion, and a region for forming a p-ch TFT (third TFT) is illustrated on the right side.

Figure 13A:
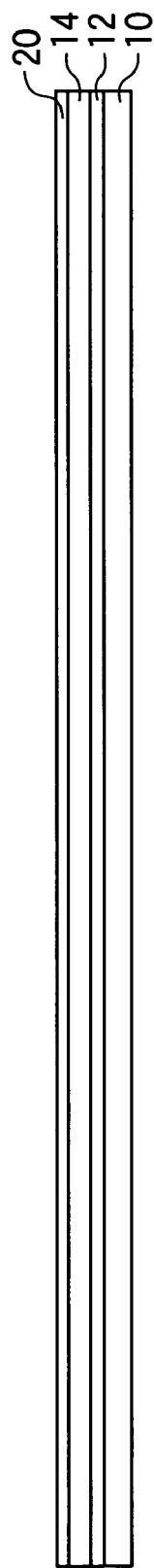
FIGS. 13A and 13B are sectional views of steps illustrating the TFT substrate according to a third embodiment of the invention and the method of manufacturing the TFT substrate.
Figure 13B:
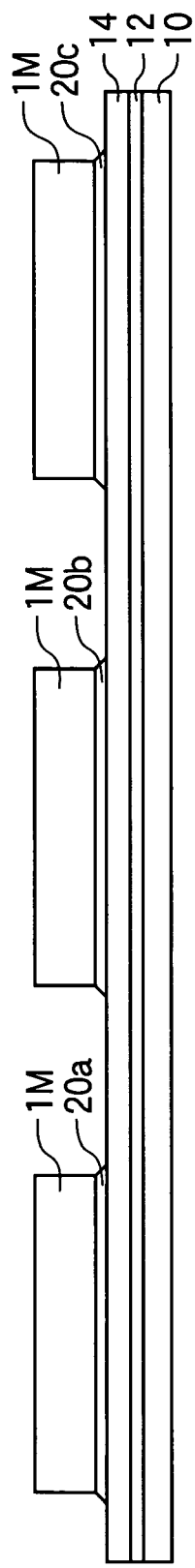

Referring, first, to FIG. 13A, on the whole surface of the glass substrate 10, there are formed an underlying SiN film 12 of a thickness of, for example, 50 nm, an underlying SiO$_2$ film 14 of a thickness of, for example, 200 nm and an a-Si film of a thickness of, for example, 40 nm in this order by using the plasma CVD apparatus. Then, by using the ion-doping apparatus, boron ions are implanted with the acceleration energy of, for example, 10 keV and in a dose amount of $1 \times 10^{12}$ cm$^{-2}$. Then, the a-Si film is crystallized by using the excimer laser to form a p-Si film 20. Referring next to FIG. 13B, the resist is applied onto the whole surface of the substrate and is patterned by using a first photomask to form resist patterns 1M. The resist patterns 1M are so formed as to cover the whole regions for forming the first to third TFTs. By using the resist patterns 1M as a mask, the p-Si film 20 is dry-etched with the fluorine-type gas to form island-like p-Si films 20a, 20b and 20c. As a method of adding boron into the a-Si film, it is also allowable to add a B$_2$H$_6$ gas to an SiH$_4$ gas stream in an amount of about several ppm at the time of forming the a-Si film instead of implanting the boron ions. Further, the boron ions may be implanted into the p-Si film 20 (20a, 20b, 20c) by using the ion-doping apparatus after crystallized with the laser or after etched like islands.

Figure 14:
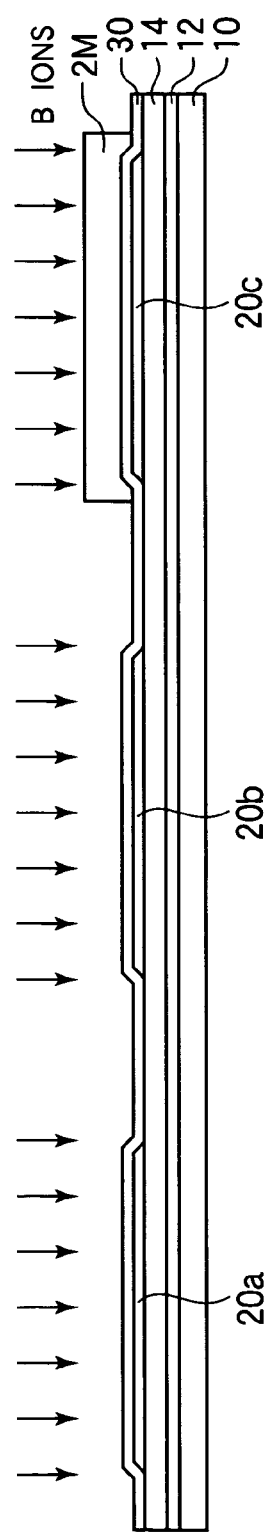
FIG. 14 is a sectional view of a step illustrating the TFT substrate according to the third embodiment of the invention and the method of manufacturing the TFT substrate.

After the resist patterns 1M are peeled off, an SiO$_2$ film of a thickness of, for example, 60 nm is formed on the whole surface of the substrate on the p-Si films 20a, 20b and 20c by using the plasma CVD apparatus to form an insulating film 30 as shown in FIG. 14. Next, the resist is applied onto the whole surface of the substrate and is patterned by using a second photomask to form a resist pattern 2M. The resist pattern 2M is so formed as to cover the whole region for forming the third TFT. Then, by using the resist pattern 2M as a mask, boron ions are implanted at a low concentration into the p-Si films 20a and 20b by using the ion-doping apparatus. The boron ions are implanted through the insulating film 30 with the acceleration energy of, for example, 40 keV and in a dose amount of $1 \times 10^{12}$ cm$^2$. Therefore, the concentration of p-type impurities in the channel regions of the first and second TFTs becomes slightly higher than the concentration of p-type impurities in the channel region of the third TFT.

After the resist pattern 2M is peeled off, a Mo film having a thickness of, for example, 200 nm is formed as shown in FIG. 15A on the whole surface of the insulating film 30 by using the sputtering apparatus to form a first electrically conducting thin film 32. Referring next to FIG. 15B, the resist is applied onto the whole surface of the substrate and is patterned by using a third photomask to form resist patterns 3M. The resist patterns 3M are formed so as to cover the regions that become the channel regions of the first and second TFTs and to cover the whole region for forming the third TFT. Then, by using the resist patterns 3M as masks, the electrically conducting thin film 32 is etched to form the lower electrode layers 34a, 34b and the electrically conducting thin film 32c. After the resist patterns 3M are peeled, phosphorus ions are implanted at a low concentration into the p-Si films 20a and 20b by using the ion-doping apparatus with the lower gate electrode layers 34a, 34b and the electrically conducting film 32c as masks. The phosphorus ions are implanted through the insulating film 30 with the acceleration energy of, for example, 40 keV and in a dose amount of $8 \times 10^{13}$ cm$^{-2}$. Then, phosphorus ions are implanted at a low concentration into the p-Si film 26a except the channel region 25a of the first TFT and into the p-Si film 26b except the channel region 25b of the second TFT.

Referring next to FIG. 16A, an Al—Ti film having a thickness of, for example, 300 nm is formed on the whole surface of the substrate on the lower gate electrode layers 34a, 34b and on the first electrically conducting thin film 32c by using the sputtering apparatus, thereby to form a second electrically conducting thin film 36. Referring next to FIG. 16B, the resist is applied onto the whole surface of the substrate and is patterned by using a fourth photomask to form resist patterns 4M. The resist patterns 4M are so formed as to cover the p-Si film 26a that becomes the channel region 25a of the first TFT and the LDD region, to cover the p-Si film 26b that becomes the channel region 25b of the second TFT and the LDD region, and to cover the region that becomes the gate electrode of the third TFT. Then, by using the resist patterns 4M as masks, the electrically conducting thin film 36 comprising the Al—Ti film is dry-etched with the chlorine-type gas to form an upper gate electrode layer 38a and electrically conducting thin films 36b and 36c. At this moment, the first electrically conducting thin film 32c comprising the Mo film remains without etched. Due to this etching, the gate electrode 39a of the first TFT is formed. The gate electrode 39a has a laminated layer structure including the lower gate electrode layer 34a formed on the channel region 25a and the upper gate electrode layer 38a formed on the channel region 25a and on the region that becomes the LDD region. After the resist patterns 4M are peeled off, phosphorus ions are implanted at a high concentration into the p-Si films 26a and 26b by using the ion-doping apparatus with the upper gate electrode layer 38a, electrically conducting thin films 36b, 36c and electrically conducting thin film 32c as masks as shown in FIG. 16C. The phosphorus ions are implanted through the insulating film 30 with the acceleration energy of, for example, 40 keV and in a dose amount of $2 \times 10^{15}$ cm$^{-2}$. Then, phosphorus ions are implanted at a high concentration into the p-Si film 26a except the LDD region 23a, thereby to form the source region 22a and the drain region 24a. Further, phosphorus ions are implanted at a high concentration into the p-Si film 26b except the LDD region 23b, thereby to form a source region 22b and a drain region 24b. Referring next to FIG. 16D, the electrically conducting thin film 32c comprising the Mo film is dry-etched with the fluorine-type gas by using the electrically conducting thin film 36c comprising the Al—Ti film as a mask. Then, the gate electrode 33c of the third TFT is formed. After the second electrically conducting thin film 36 is etched, the phosphorus ions may be implanted and the first electrically conducting thin film 32c may be etched while leaving the resist patterns 4M without any particular problem.

Referring next to FIG. 17A, the resist is applied onto the whole surface of the substrate and is patterned by using a fifth photomask to form resist patterns 5M. The resist patterns 5M are formed on the whole region for forming the first TFT and on the region that becomes the gate electrode of the second TFT. Then, boron ions are implanted at a high concentration into the source region 22b, drain region 24b and p-Si film 20c by using the ion-doping apparatus with the resist patterns 5M and the electrically conducting thin films 36b, 36c as masks. The boron ions are implanted through the insulating film 30 with the acceleration energy of, for example, 40 keV and in a dose amount of $1 \times 10^{15}$ cm$^{-2}$. Then, boron ions are implanted at a high concentration into the p-Si film 20c of the p-ch TFT other than the channel region 25c, thereby to form the source region 22c and the drain region 24c. Here, the boron ions are implanted into the source region 22b and the drain region 24b of the second n-ch TFT, too. However, the dose amount of boron ions is nearly one-half the dose amount of phosphorus ions that have already been implanted, and the type of electric conduction is not inverted from the n-type into the p-type. Referring next to FIG. 17B, the electrically conducting thin films 36b and 36c comprising the Al—Ti films are dry-etched with the chlorine-type gas using the resist patterns 5M as masks. The gate electrode 33c comprising the Mo film is not removed by this etching but remains. Then, the gate electrode 39b of the second TFT is formed, and the electrically conducting thin film 36c on the gate electrode 33c of the third TFT is removed. Here, the second TFT is of the partial GOLD structure, and the gate electrode 39b is so formed as to partially cover the channel region 25b and the LDD region 23b. The gate electrode 39b has a laminated layer structure including a lower gate electrode layer 34b formed on the channel region 25b and an upper gate electrode layer 38b formed on the portions of the channel region 25b and of the LDD region 23b. Next, the resist patterns 5M are peeled off by using the ashing apparatus, followed by the irradiation with the excimer laser as shown in FIG. 17C to activate the implanted impurities. If both the first electrically conducting thin film 32 and the second electrically conducting thin film 36 are formed by using a high-melting metal or a semiconductor material, then, the heat treatment may be conducted by using an annealing furnace to activate the impurities.

Referring next to FIG. 18A, an SiN film having a thickness of, for example, 370 nm is formed on the whole surface of the substrate on the gate electrodes 39a, 39b and 33c by using a plasma CVD apparatus, thereby to form a first interlayer insulating film 40 containing hydrogen. The interlayer insulating film 40 is hydrogenated by annealing in a hydrogen atmosphere or by the treatment with a hydrogen plasma. Then, the heat treatment is conducted in a nitrogen atmosphere at 380° C. for two hours. Referring next to FIG. 18B, the resist is applied to the whole surface of the substrate and is patterned by using a sixth photomask to form resist patterns 6M. Then, the interlayer insulating film 40 and the insulating film 30 are dry-etched with the fluorine-type gas by using the resist patterns 6M as masks to form contact holes 42a, 42b and 42c.

Figure 19:
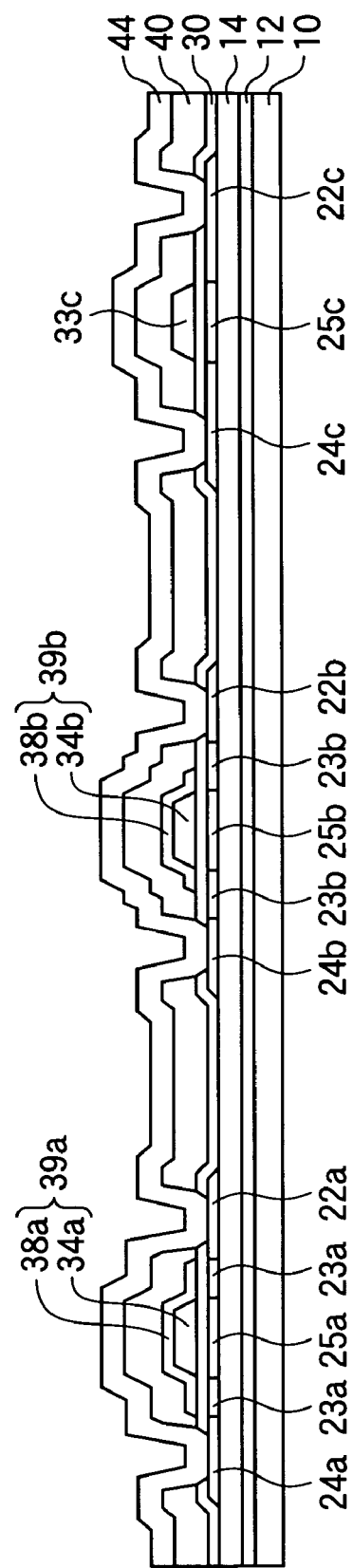
FIG. 19 is a sectional view of a step illustrating the TFT substrate according to the third embodiment of the invention and the method of manufacturing the TFT substrate.
Figure 20:
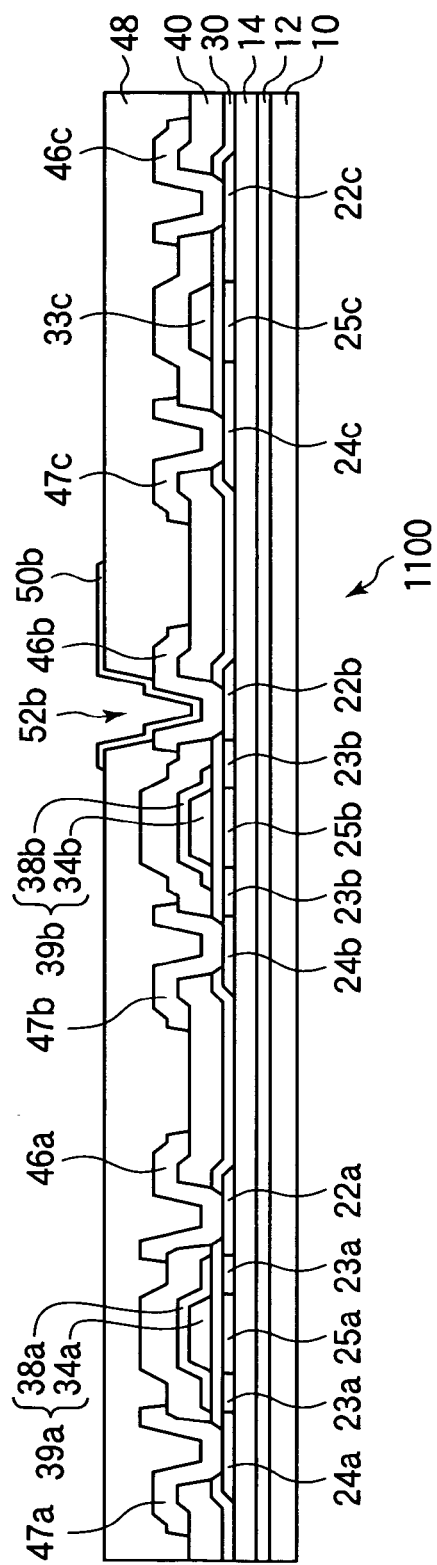
FIG. 20 is a sectional view of a step illustrating the TFT substrate according to the third embodiment of the invention and the method of manufacturing the TFT substrate.

After the resist patterns 6M are peeled off, there are formed a Ti film having a thickness of, for example, 100 nm, an Al film having a thickness of 200 nm and a Ti film having a thickness of 100 nm in this order on the whole surface of the interlayer insulating film 40 by using a sputtering apparatus, thereby to form a third electrically conducting thin film 44 as shown in FIG. 19. Next, the resist is applied onto the whole surface of the substrate and is patterned by using a seventh photomask to form resist patterns (not shown). Then, the electrically conducting thin film 44 is dry-etched with the chlorine-type gas by using the resist patterns as masks, thereby to form source electrodes 46a, 46b, 46c and drain electrodes 47a, 47b, 47c as shown in FIG. 20. The source electrodes 46a, 46b and 46c are connected to the source regions 22a, 22b and 22c, respectively. Further, the drain electrodes 47a, 47b and 47c are connected to the drain regions 24a, 24b and 24c, respectively. The resist patterns are, then, peeled off. Through the above steps, a TFT device according to the embodiment is completed including the n-ch TFT (first TFT) of the GOLD structure on the left side in FIG. 20, the n-ch TFT (second TFT) of the partial GOLD structure at the central portion in FIG. 20 and the p-ch TFT (third TFT) on the right side in FIG. 20.

Next, an SiN film having a thickness of, for example, 400 nm is formed on the whole surface of the substrate on the source electrodes 46a, 46b, 46c and on the drain electrodes 47a, 47b, 47c by using the plasma CVD apparatus, thereby to form a second interlayer insulating film 48. Next, the resist is applied onto the whole surface of the substrate and is patterned by using an eighth photomask, thereby to form resist patterns (not shown). Then, by using the resist patterns as masks, the interlayer insulating film 48 is dry-etched with the fluorine-type gas to form a contact hole 52b on the source electrode 46b. Next, an ITO film having a thickness of, for example, 70 nm is formed on the whole surface of the interlayer insulating film 48 by using a sputtering apparatus, thereby to form a fourth electrically conducting thin film (not shown). Next, the resist is applied onto the whole surface of the substrate and is patterned by using a ninth photomask to form resist patterns (not shown). Then, by using the resist patterns as masks, the fourth electrically conducting thin film is etched by using the ITO etcher, thereby to form a pixel electrode 50b. Through the above steps, a TFT substrate 1100 is completed including the n-ch TFT (TFT for driving pixel) of the partial GOLD structure at the central portion of FIG. 20, the n-ch TFT of the GOLD structure on the left side in FIG. 20, and the p-ch TFT (TFT for the peripheral circuit) on the right side in FIG. 20.

Referring to FIG. 20, in the TFT substrate 1100 formed by the method of manufacturing the TFT substrate according to this embodiment, the gate electrodes 39a and 39b of the first and second TFTs and the gate electrode 33c of the third TFT are formed in different structures. That is, the gate electrodes 39a and 39b are constituted as a laminate of the first electrically conducting thin film and a second electrically conducting thin film having a width larger than that of the first electrically conducting thin film, and the gate electrode 33c is constituted by a single layer of the first electrically conducting thin film. In the TFT substrate 1100 formed by the method of manufacturing the TFT substrate according to this embodiment, further, p-type impurities are implanted at a low concentration into the channel regions 25a and 25b of the first and second TFTs and into the channel region 25c of the third TFT, the concentration of the p-type impurities in the channel regions 25a and 25b of the first and second TFTs being higher than the concentration of p-type impurities in the channel region 25c of the third TFT.

In the method of manufacturing the TFT device and the TFT substrate according to this embodiment, the gate electrodes of the first to third TFTs are formed stepwise by using two kinds of electrically conducting materials, an etching gas which selectively removes either one of the electrically conducting materials, and a plurality of resist patterns used as masks at the time of implanting impurities. According to this method, the photolithography step is effected seven times for forming the TFT and the photolithography step is effected nine times for manufacturing the TFT substrate 1100 including pixel electrodes 50b. Therefore, the photolithography steps can be decreased by at least one time as compared to the related art to improve the productivity of the TFT substrate 1100 and to decrease the cost of production. Through the photolithography step effected the same number of times as for the TFT substrate equipped with TFTs of the non-GOLD structure, further, there is manufactured the TFT substrate 1100 having the n-ch TFTs of the GOLD structure maintaining high reliability.

Next, the thin-film transistor device, the thin-film transistor substrate provided therewith and the method of manufacturing the same according to a fourth embodiment of the invention will be described with reference to FIGS. 21A to 23. FIGS. 21A to 23 are sectional views of steps illustrating the TFT device and the method of manufacturing the TFT substrate according to this embodiment. In FIGS. 21A to 23, a region for forming an n-ch TFT (first TFT) of the GOLD structure is illustrated on the left side, a region for forming an n-ch TFT (second TFT) of the partial GOLD structure is illustrated at the central portion, and a region for forming a p-ch TFT (third TFT) is illustrated on the right side. In the method of manufacturing the TFT device according to this embodiment, the steps of up to forming the gate electrode (lower layer of the gate electrode 33c' of this embodiment) 33c of the third TFT are the same as those of the third embodiment illustrated in FIGS. 13A to 16D, and are not described here. In this embodiment, the electrically conducting thin film 36c is not removed but is used as the upper layer of the gate electrode 33c'.

Referring to FIG. 21A, boron ions are implanted at a high concentration into the source regions 22a, 22b, drain regions 24a, 24b and p-Si film 20c (see FIG. 16D) by using the upper gate electrode layer 38a and electrically conducting thin films 36b, 36c as masks. The boron ions are implanted through the insulating film 30 with the acceleration energy of, for example, 40 keV and in a dose amount of $1 \times 10^{15}$ cm$^{-2}$. Then, the boron ions are implanted at a high concentration into the p-Si film 20c of the third TFT except the channel region 25c, thereby to form the source region 22c and the drain region 24c. Here, the boron ions are implanted into the source regions 22a, 22b and the drain regions 24a, 24b of the first and the second n-ch TFTs, too. However, the dose amount of boron ions is nearly one-half the dose amount of phosphorus ions that have already been implanted, and the type of electric conduction is not inverted from the n-type into the p-type. Referring next to FIG. 21B, the resist is applied to the whole surface of the substrate and is patterned by using a fifth photomask to form resist patterns 5M. The resist patterns 5M are formed on the whole region for forming the first TFT, on the region that becomes the gate electrode of the second TFT and on the whole region for forming the third TFT. Then, by using the resist patterns 5M as masks, the electrically conducting thin film 36b is dry-etched with the chlorine-type gas, thereby to form a gate electrode 39b. The gate electrode 39b has a laminated layer structure including the lower gate electrode layer 34b formed on the channel region 25b and the upper gate electrode layer 38b formed on portions of the channel region 25b and the LDD region 23b. Referring next to FIG. 21C, the resist patterns 5M are peeled off by using the ashing apparatus, followed by the irradiation with the excimer laser to activate the implanted impurities.

Figure 22:
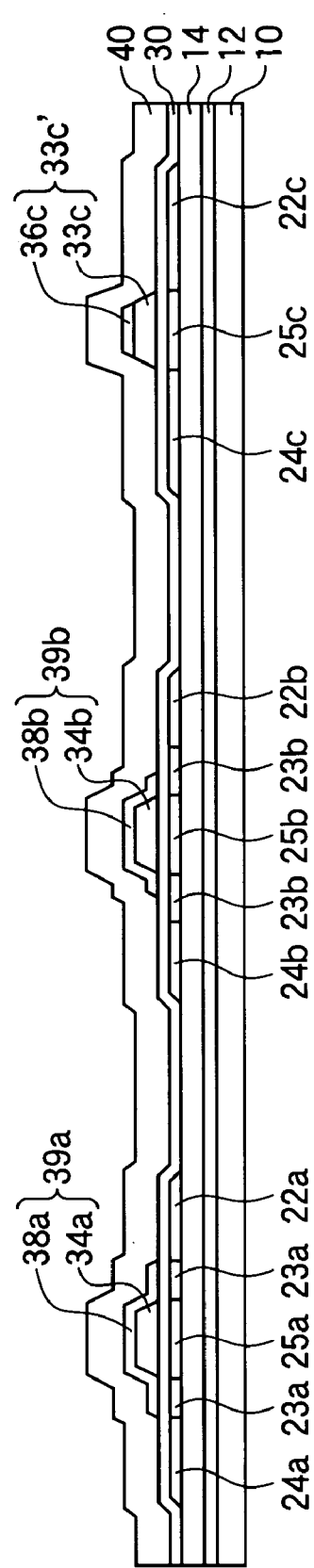
FIG. 22 is a sectional view of a step illustrating the TFT substrate according to the fourth embodiment of the invention and the method of manufacturing the TFT substrate.
Figure 23:
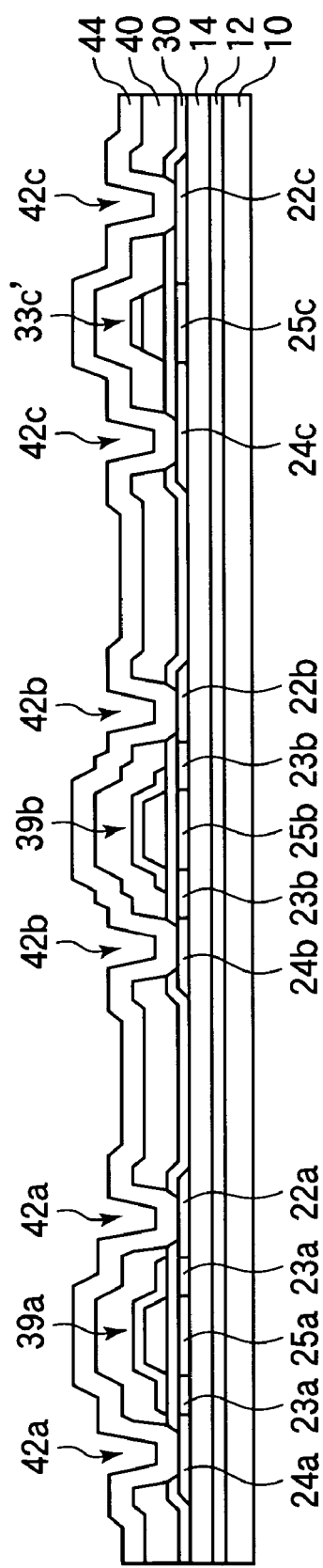
FIG. 23 is a sectional view of a step illustrating the TFT substrate according to the fourth embodiment of the invention and the method of manufacturing the TFT substrate.

Next, a first interlayer insulating film 40 is formed on the whole surface of the substrate on the gate electrodes 39a, 39b and 33c' in the same manner as in the third embodiment (see FIG. 22). Referring next to FIG. 23, the interlayer insulating film 40 and the insulating film 30 are patterned by using a sixth photomask to form contact holes 42a, 42b and 42c. Next, an electrically conducting film 44 is formed on the whole surface of the substrate on the interlayer insulating film 40. Then, the electrically conducting thin film 44 is patterned by using a seventh photomask to form source electrodes 46a, 46b, 46c and drain electrodes 47a, 47b, 47c (not shown). Next, a second interlayer insulating film is formed on the whole surface of the substrate on the source electrodes 46a, 46b, 46c and on the drain electrodes 47a, 47b, 47c. Next, the second interlayer insulating film is patterned by using an eighth photomask to form a contact hole on the source electrode 46b. Then, a fourth electrically conducting thin film is formed on the whole surface of the substrate on the second interlayer insulating film and is patterned by using a ninth photomask to form a pixel electrode. Through the above steps, a TFT substrate 1100 is completed including the n-ch TFT (TFT for driving pixel) of the partial GOLD structure, the n-ch TFT of the GOLD structure and the p-ch TFT (TFT for the peripheral circuit).

Referring to FIG. 23, in the TFT substrate 1100 formed by the method of manufacturing the TFT substrate according to this embodiment, the gate electrodes 39a and 39b of the first and second TFTs and the gate electrode 33c' of the third TFT are formed in different structures. That is, the gate electrodes 39a and 39b are constituted as a laminate of the first electrically conducting thin film and a second electrically conducting thin film having a width larger than that of the first electrically conducting thin film, and the gate electrode 33c' is constituted as a laminate of the first electrically conducting thin film and the second electrically conducting thin film having nearly the same width. Here, the resist masks 5M may have the shape nearly the same as that of the third embodiment. In this case, the gate electrode 33c' (33c) of the third TFT is constituted by a single layer of the first electrically conducting thin film. In the TFT substrate 1100 formed by the method of manufacturing the TFT substrate according to this embodiment, further, p-type impurities are implanted at a low concentration into the channel regions 25a and 25b of the first and second TFTs and into the channel region 25c of the third TFT, the concentration of the p-type impurities in the channel regions 25a, 25b of the first and second TFTs being higher than the concentration of p-type impurities in the channel region 25c of the third TFT.

The method of manufacturing the TFT device and the TFT substrate according to this embodiment is the same as that of the first embodiment with the exception of forming the resist patterns 5M after the p-type impurities of a high concentration are implanted by using the gate electrode 39a and the second electrically conducting thin films 36b, 36c as masks, and partially etching the electrically conducting thin film 36b of the second TFT by using the resist patterns 5M as masks. According to the method of manufacturing the TFT device and the TFT substrate of this embodiment, the photolithography step is effected seven times for forming the TFT and the photolithography step is effected nine times for manufacturing the TFT substrate 1100 including pixel electrodes 50b. Therefore, the photolithography steps can be decreased by at least one time as compared to the related art to improve the productivity of the TFT substrate 1100 and to decrease the cost of production. Through the photolithography step effected the same number of times as for the TFT substrate equipped with TFTs of the non-GOLD structure, further, there is manufactured the TFT substrate 1100 having the n-ch TFTs of the GOLD structure maintaining high reliability.

Next, the thin-film transistor device, the thin-film transistor substrate provided therewith and the method of manufacturing the same according to a fifth embodiment of the invention will be described with reference to FIGS. 24A to 31. FIGS. 24A to 31 are sectional views of steps illustrating the TFT device and the method of manufacturing the TFT substrate according to this embodiment. In FIGS. 24A to 31, a region for forming an n-ch TFT (first TFT) of the GOLD structure is illustrated on the left side, a region for forming an n-ch TFT (second TFT) of the partial GOLD structure is illustrated at the central portion, and a region for forming a p-ch TFT (third TFT) is illustrated on the right side.

Referring, first, to FIG. 24A, on the whole surface of the glass substrate 10, there are formed an underlying SiN film 12 of a thickness of, for example, 50 nm, an underlying SiO$_2$ film 14 of a thickness of, for example, 200 nm and an a-Si film of a thickness of, for example, 40 nm in this order by using the plasma CVD apparatus. Then, by using the ion-doping apparatus, boron ions are implanted into the whole surface of the a-Si film. The boron ions are implanted with the acceleration energy of, for example, 10 keV and in a dose amount of $1 \times 10^{12}$ cm$^{-2}$. Then, the a-Si film is crystallized by using the excimer laser to form a p-Si film 20. Referring next to FIG. 24B, the resist is applied onto the whole surface of the substrate and is patterned by using a first photomask to form resist patterns 1M. The resist patterns 1M are so formed as to cover the whole regions for forming the first to third TFTs. By using the resist patterns 1M as masks, the p-Si film 20 is dry-etched with the fluorine-type gas to form island-like p-Si films 20a, 20b and 20c. As a method of adding boron into the a-Si film, it is also allowable to add a $B_2H_6$ gas to an $SiH_4$ gas stream in an amount of about several ppm at the time of forming the a-Si film instead of implanting the boron ions. Further, the boron ions may be implanted into the p-Si film 20 (20a, 20b and 20c) by using the ion-doping apparatus after crystallized with the laser or after etched like islands.

Figure 25:
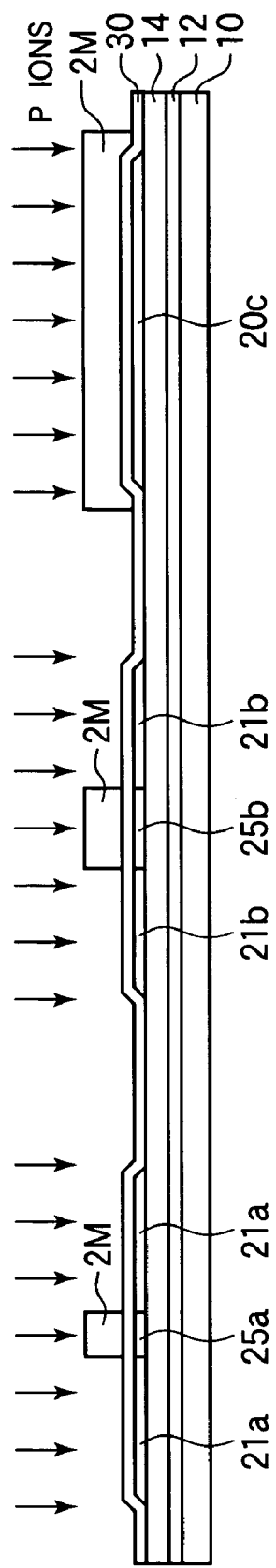
FIG. 25 is a sectional views of a step illustrating the TFT substrate according to the fifth embodiment of the invention and the method of manufacturing the TFT substrate.

After the resist patterns 1M are peeled off, an $SiO_2$ film of a thickness of, for example, 60 nm is formed on the whole surface of the substrate on the p-Si films 20a, 20b and 20c by using the plasma CVD apparatus to form an insulating film 30 as shown in FIG. 25. Next, the resist is applied onto the whole surface of the substrate and is patterned by using a second photomask to form resist patterns 2M. The resist patterns 2M are so formed as to cover the region that becomes a channel region 25a of the first TFT, the region that becomes the channel region 25b of the second TFT and the whole region for forming the third TFT. Then, by using the resist patterns 2M as masks, phosphorus ions are implanted at a low concentration into the p-Si films 20a and 20b by using the ion-doping apparatus. The phosphorus ions are implanted through the insulating film 30 with the acceleration energy of, for example, 40 keV and in a dose amount of $8 \times 10^{13}$ cm$^{-2}$. Therefore, the phosphorus ions are implanted into the p-Si film 21a except the channel region 25a of the first n-ch TFT and into the p-Si film 21b except the channel region 25b of the second n-ch TFT.

Figure 26A:
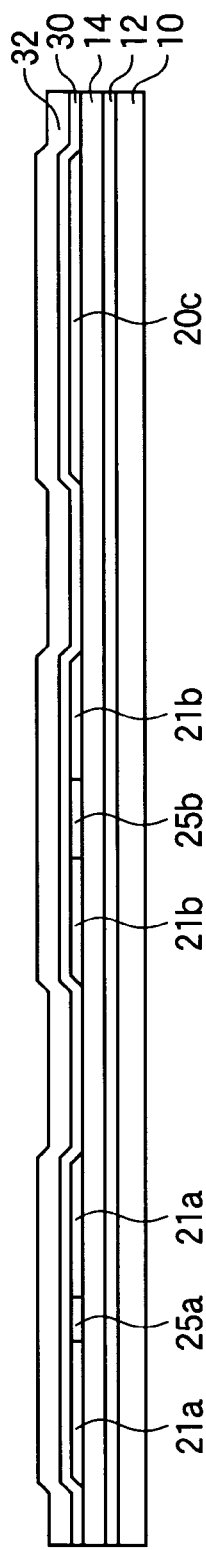
FIGS. 26A to 26C are sectional views of steps illustrating the TFT substrate according to the fifth embodiment of the invention and the method of manufacturing the TFT substrate.
Figure 26B:
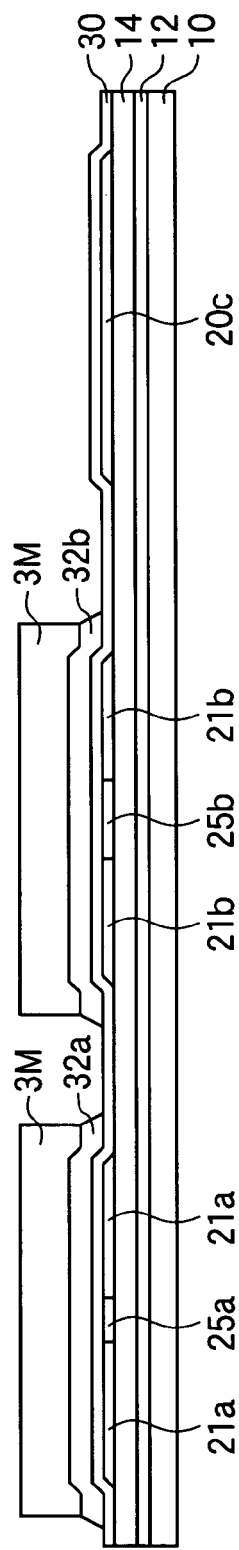
Figure 26C:
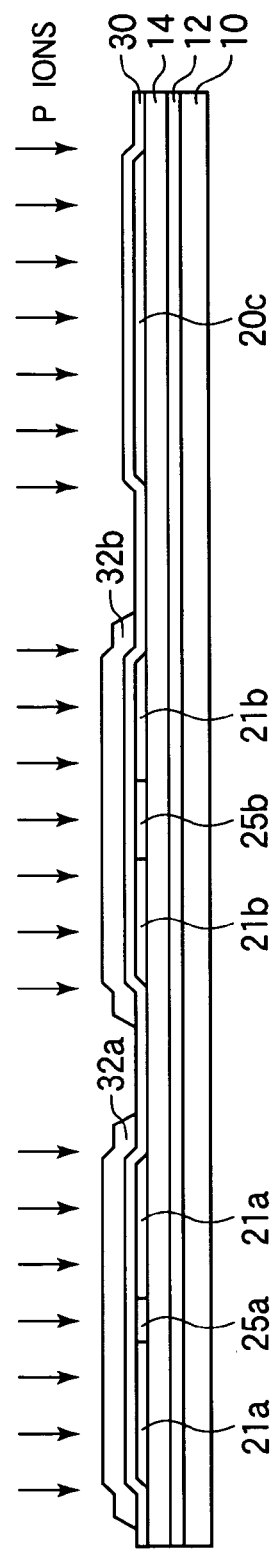

After the resist patterns 2M are peeled off, a Mo film having a thickness of, for example, 200 nm is formed as shown in FIG. 26A on the whole surface of the insulating film 30 by using the sputtering apparatus to form a first electrically conducting thin film 32. Referring next to FIG. 26B, the resist is applied onto the whole surface of the substrate and is patterned by using a third photomask to form resist patterns 3M. The resist patterns 3M are formed so as to cover the whole regions for forming the first and second TFTs. Then, by using the resist patterns 3M as masks, the electrically conducting thin film 32 is etched to form electrically conducting thin films 32a and 32b. After the resist patterns 3M are peeled, phosphorus ions are implanted as shown in FIG. 26C into the p-Si film 20c by using the ion-doping apparatus with the electrically conducting thin films 32a and 32b as masks. The phosphorus ions are implanted through the insulating film 30 with the acceleration energy of, for example, 40 keV and in a dose amount of $1 \times 10^{12}$ cm$^{-2}$. Thus, P-type impurities and n-type impurities are implanted into the channel region of the third TFT.

Referring next to FIG. 27A, an Al—Ti film having a thickness of, for example, 300 nm is formed on the whole surface of the substrate on the first electrically conducting thin films 32a and 32b by using the sputtering apparatus thereby to form a second electrically conducting thin film 36. Referring next to FIG. 27B, the resist is applied onto the whole surface of the substrate and is patterned by using a fourth photomask to form resist patterns 4M. The resist patterns 4M are so formed as to cover the regions that become the gate electrodes of the first to third TFTs. Then, by using the resist patterns 4M as masks, the electrically conducting thin film 36 comprising the Al—Ti film is dry-etched with the chlorine-type gas to form upper gate electrode layers 38a, 38b and a gate electrode 38c. At this moment, the first electrically conducting thin films 32a and 32b comprising the Mo film remain without etched. After the resist patterns 4M are peeled off, boron ions are implanted at a high concentration into the p-Si film 20c by using the ion-doping apparatus with the electrically conducting thin films 32a, 32b and the gate electrode 38c as masks as shown in FIG. 27C. The boron ions are implanted through the insulating film 30 with the acceleration energy of, for example, 40 keV and in a dose amount of $1 \times 10^{15}$ cm$^{-2}$. Thus, boron ions are implanted at a high concentration into the p-Si film 20c except the channel region 25c, thereby to form the source region 22c and the drain region 24c. Referring next to FIG. 27D, the electrically conducting thin films 32a and 32b comprising the Mo film are dry-etched with the fluorine-type gas by using the upper gate electrode layers 38a and 38b comprising the Al—Ti film as masks. Thus, there are formed the gate electrode 39a of the first TFT and the gate electrode 39b of the second TFT. The gate electrode 39a has a laminated layer structure of the lower gate electrode layer 34a and the upper gate electrode layer 38a, and the gate electrode 39b has a laminated layer structure of the lower gate electrode layer 34b and the upper gate electrode layer 38b. After the upper gate electrode layers 38a and 38b are formed, the boron ions may be implanted and the first electrically conducting thin films 32a and 32b may be etched while leaving the resist patterns 4M without any particular problem.

Referring next to FIG. 28A, the resist is applied onto the whole surface of the substrate and is patterned by using a fifth photomask to form resist patterns 5M. The resist patterns 5M are formed so as to cover the regions that become the channel region of the second TFT and the LDD region and to cover the whole region for forming the third TFT. Then, phosphorus ions are implanted at a high concentration into the p-Si films 21a and 21b by using the ion-doping apparatus with the resist patterns 5M and the gate electrode 39a as masks. The phosphorus ions are implanted through the insulating film 30 with the acceleration energy of, for example, 40 keV and in a dose amount of $1 \times 10^{15}$ cm$^{-2}$. Thus, phosphorus ions are implanted at a high concentration into the p-Si film 21a of the first TFT except the LDD region 23a thereby to form the source region 22a and the drain region 24a. Further, the phosphorus ions are implanted at a high concentration into the p-Si film 21b of the second TFT except the LDD region 23b, thereby to form the source region 22b and the drain region 24b. Next, the resist patterns 5M are peeled off by using the ashing apparatus, followed by the irradiation with the excimer laser as shown in FIG. 28B to activate the implanted impurities. If both the first electrically conducting thin film 32 and the second electrically conducting thin film 36 are formed by using a high-melting metal or a semiconductor material, then, the heat treatment may be conducted by using an annealing furnace to activate the impurities.

Figure 29A:
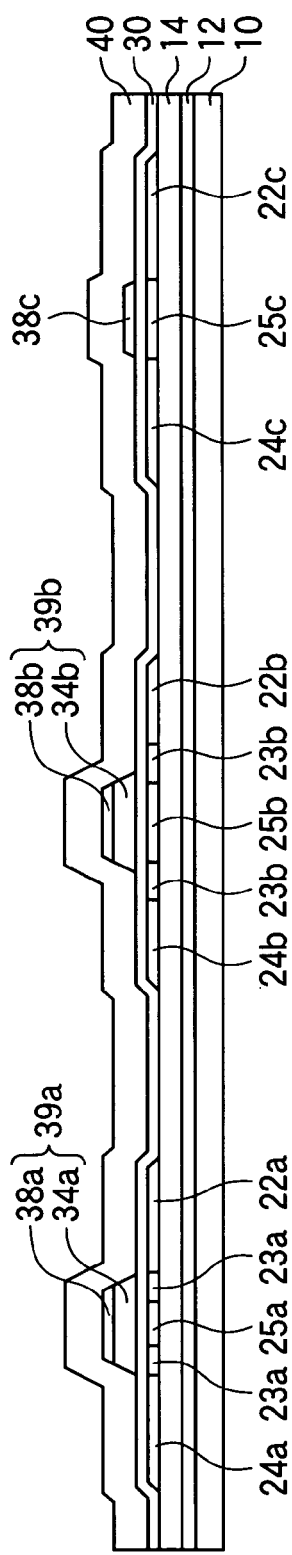
FIGS. 29A and 29B are sectional views of steps illustrating the TFT substrate according to the fifth embodiment of the invention and the method of manufacturing the TFT substrate.
Figure 29B:
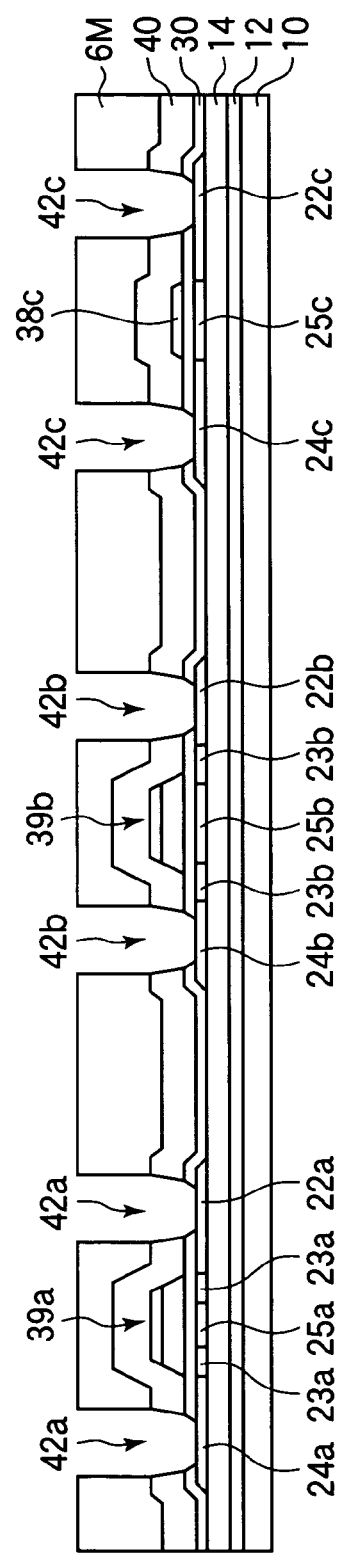
Figure 32A:
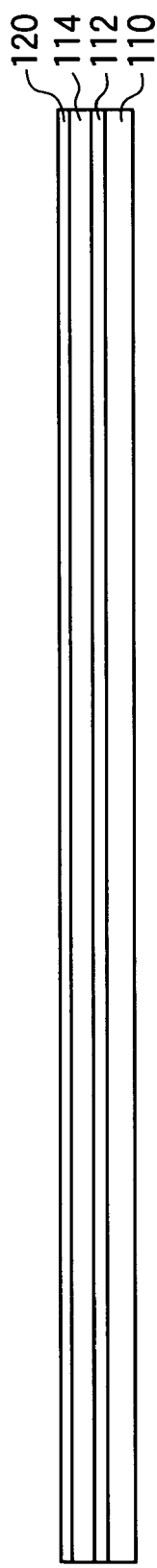
FIGS. 32A and 32B are sectional views of steps illustrating a conventional method of manufacturing a p-Si TFT substrate.
Figure 32B:
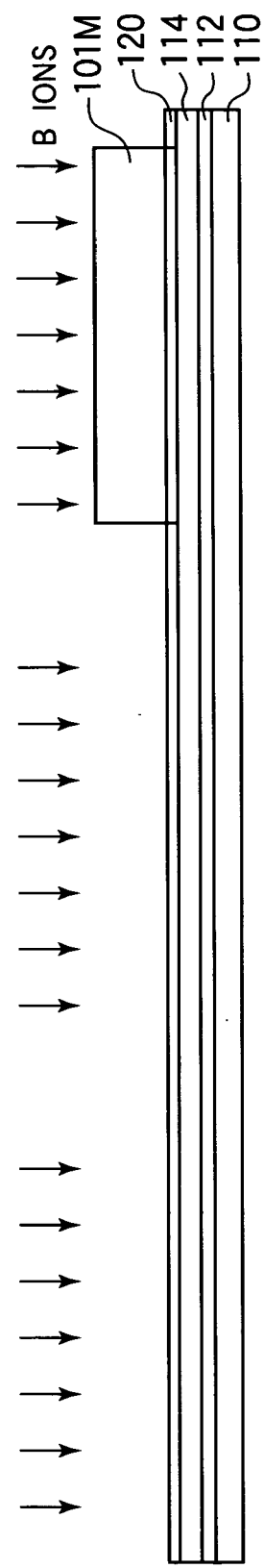
Figure 33:
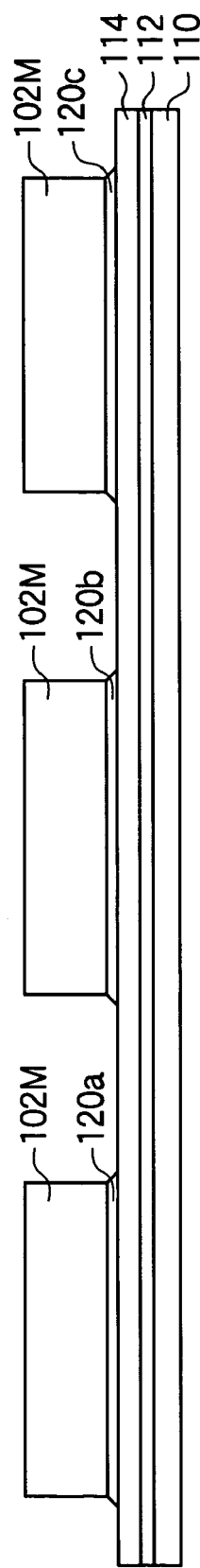
FIG. 33 is a sectional view of a step illustrating the conventional method of manufacturing the p-Si TFT substrate.
Figure 34:
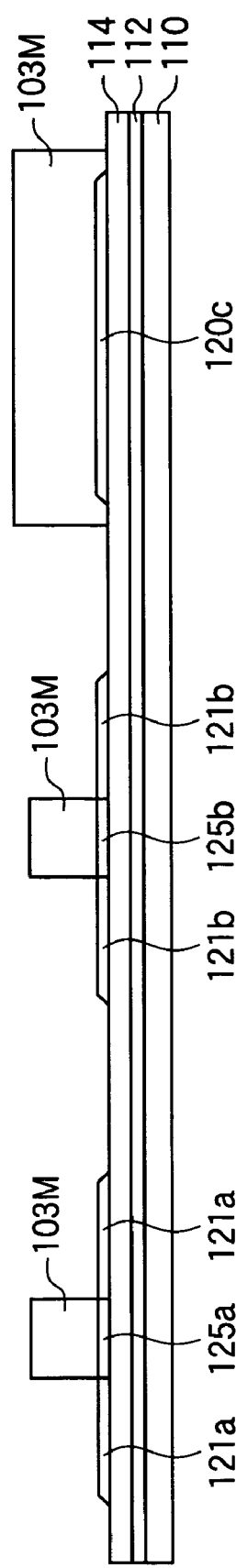
FIG. 34 is a sectional view of a step illustrating the conventional method of manufacturing the p-Si TFT substrate.
Figure 38A:
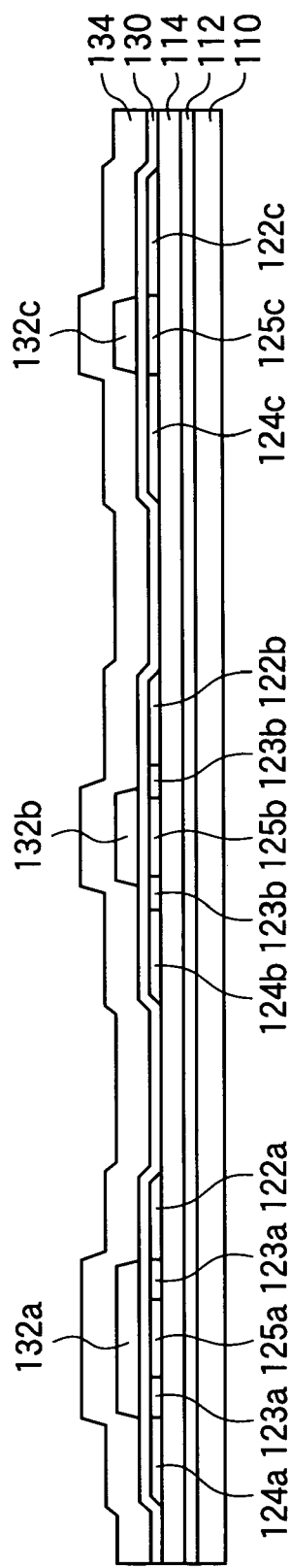
FIGS. 38A and 38B are sectional views of steps illustrating the conventional method of manufacturing the p-Si TFT substrate.
Figure 38B:
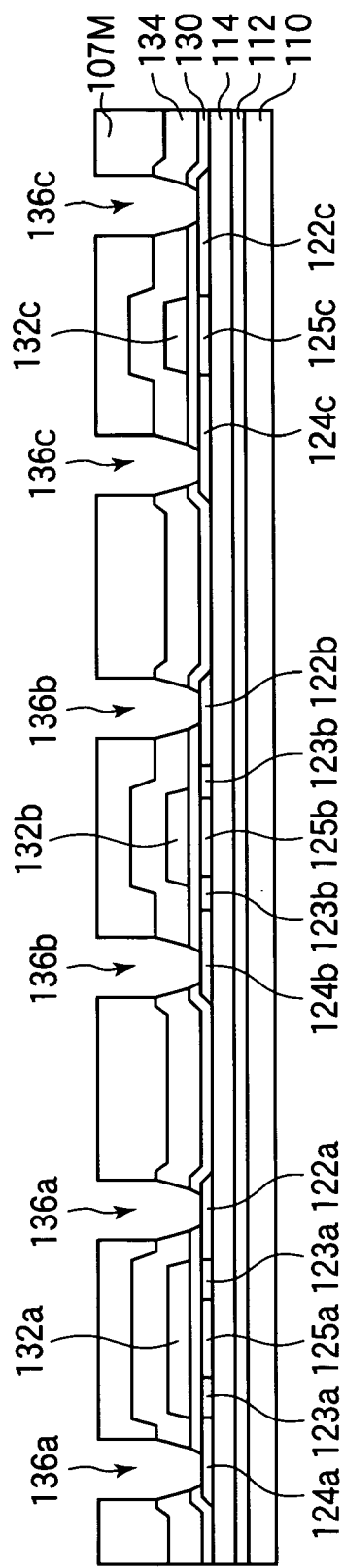

Referring next to FIG. 29A, an SiN film having a thickness of, for example, 370 nm is formed on the whole surface of the substrate on the gate electrodes 39a, 39b and 38c by using a plasma CVD apparatus, thereby to form a first interlayer insulating film 40 containing hydrogen. The interlayer insulating film 40 is hydrogenated by annealing in a hydrogen atmosphere or by the treatment with a hydrogen plasma. Then, the heat treatment is conducted in a nitrogen atmosphere at 380° C. for two hours. Referring next to FIG. 29B, the resist is applied to the whole surface of the substrate and is patterned by using a sixth photomask to form resist patterns 6M. Then, the interlayer insulating film 40 and the insulating film 30 are dry-etched with the fluorine-type gas by using the resist patterns 6M as masks to form contact holes 42a, 42b and 42c.

After the resist patterns 6M are peeled off, there are formed a Ti film having a thickness of, for example, 100 nm, an Al film having a thickness of 200 nm and a Ti film having a thickness of 100 nm in this order on the whole surface of the substrate on the interlayer insulating film 40 by using a sputtering apparatus, thereby to form a third electrically conducting thin film 44 as shown in FIG. 30A. Next, the resist is applied onto the whole surface of the substrate and is patterned by using a seventh photomask to form resist patterns 7M. Then, the electrically conducting thin film 44 is dry-etched with the chlorine-type gas by using the resist patterns 7M as masks, thereby to form source electrodes 46a, 46b, 46c and drain electrodes 47a, 47b, 47c. The source electrodes 46a, 46b and 46c are connected to the source regions 22a, 22b and 22c, respectively. Further, the drain electrodes 47a, 47b and 47c are connected to the drain regions 24a, 24b and 24c respectively. The resist patterns 7M are, then, peeled off. Through the above steps, a TFT device according to the embodiment is completed including the n-ch TFT (first TFT) of the GOLD structure, the n-ch TFT (second TFT) of the partial GOLD structure and the p-ch TFT (third TFT).

Referring next to FIG. 31, an SiN film having a thickness of, for example, 400 nm is formed on the whole surface of the substrate on the source electrodes 46a, 46b, 46c and on the drain electrodes 47a, 47b, 47c by using the plasma CVD apparatus, thereby to form a second interlayer insulating film 48. Next, the resist is applied onto the whole surface of the substrate and is patterned by using an eighth photomask, thereby to form resist patterns (not shown). Then, by using the resist patterns as masks, the interlayer insulating film 48 is dry-etched with the fluorine-type gas to form a contact hole 52b on the source electrode 46b. Next, an ITO film having a thickness of, for example, 70 nm is formed on the whole surface of the substrate on the interlayer insulating film 48 by using a sputtering apparatus, thereby to form a fourth electrically conducting thin film (not shown). Next, the resist is applied onto the whole surface of the substrate and is patterned by using a ninth photomask to form resist patterns (not shown). Then, by using the resist patterns as masks, the fourth electrically conducting thin film is etched by using the ITO etcher, thereby to form a pixel electrode 50b. Through the above steps, a TFT substrate 1100 is completed including the n-ch TFT (TFT for driving pixel) of the partial GOLD structure at the central portion of FIG. 31, the n-ch TFT of the GOLD structure on the left side in FIG. 31 and the p-ch TFT (TFT for the peripheral circuit) on the right side in FIG. 31.

Referring to FIG. 31, in the TFT substrate 1100 formed by the method of manufacturing the TFT substrate according to this embodiment, the gate electrodes 39a, 39b of the first and second TFTs and the gate electrode 38c of the third TFT are formed in different structures. That is, the gate electrodes 39a and 39b are constituted as a laminate of the first electrically conducting thin film and the second electrically conducting thin film, and the gate electrode 38c is constituted by a single layer of the second electrically conducting thin film. In the TFT substrate 1100 formed by the method of manufacturing the TFT substrate according to this embodiment, further, p-type impurities are implanted at a low concentration into the channel regions 25a and 25b of the first and second TFTs, and p-type impurities as well as n-type impurities are implanted at low concentrations into the channel region 25c of the third TFT.

In the method of manufacturing the TFT device and the TFT substrate according to this embodiment, the gate electrodes 39a, 39b and 38c of the first to third TFTs are formed stepwise by using two kinds of electrically conducting materials, an etching gas which selectively removes either one of the electrically conducting materials, and a plurality of resist patterns used as masks at the time of implanting impurities. Therefore, the photolithography step is effected seven times for forming the TFT and the photolithography step is effected nine times for manufacturing the TFT substrate 1100 including pixel electrodes 50b. Therefore, the photolithography steps can be decreased by at least one time as compared to the related art to improve the productivity of the TFT substrate 1100 and to decrease the cost of production. Through the photolithography step effected the same number of times as for the TFT substrate equipped with TFTs of the non-GOLD structure, further, there is manufactured the TFT substrate 1100 having the n-ch TFTs of the GOLD structure maintaining high reliability.

The invention can be modified in a variety of ways not being limited to the above embodiments only.

Though the above embodiments have dealt with the liquid crystal display devices, the invention is in no way limited thereto only but can also be applied to any other display devices such as organic EL display devices and inorganic EL display devices.

What is claimed is:

1. A thin-film transistor device comprising:
   a first thin-film transistor of n-type of electric conduction having a first channel region, a first low-concentration impurity region and a first gate electrode covering nearly the whole first low-concentration impurity region and the first channel region;
   a second thin-film transistor of n-type of electric conduction having a second channel region, a second low-concentration impurity region and a second gate electrode covering part of the second low-concentration impurity region and the second channel region; and
   a third thin-film transistor of p-type of electric conduction having a third channel region and a third gate electrode covering the third channel region,
   wherein:
   the impurities are contained at different concentrations in the first and second channel regions and in the third channel region; and
   the first and second gate electrodes have a different layer structure or are formed from different materials than the third gate electrode.

2. A thin-film transistor device according to claim 1, wherein the first and second channel regions contain impurities of the p-type only, and the third channel region contains both p-type impurities and n-type impurities.

3. A thin-film transistor substrate having a plurality of bus lines formed on a base substrate in a manner intersecting one another via an insulating film, and thin-film transistor devices formed in pixel regions arranged like a matrix on a display region on the base substrate and in peripheral circuits arranged surrounding the display region, wherein the thin-film transistor devices include thin-film transistor devices according to claim 1.

4. A display device having a substrate provided with thin-film transistors as switching elements, wherein the substrate is a thin-film transistor substrate according to claim 3.

5. A thin-film transistor device according to claim 1, wherein the first to third channel regions contain impurities of the p-type only, and the first and second channel regions contain impurities of the p-type at a concentration higher than that in the third channel region.

6. A thin-film transistor device according to claim 5, wherein the first and second gate electrodes are formed by using a first electrically conducting material, and the third gate electrode is formed by using a second electrically conducting material different from the first electrically conducting material.

7. A thin-film transistor device according to claim 5, wherein the first and second gate electrodes are formed by using a first electrically conducting material, and the third gate electrode has a laminated layer structure including a first layer formed by using a second electrically conducting material different from the first electrically conducting material and a second layer formed by using the first electrically conducting material on the first layer.

8. A thin-film transistor device according to claim 5, wherein the first and second gate electrodes have a laminated layer structure including a first layer formed by using a first electrically conducting material and a second layer formed on the first layer by using a second electrically conducting material different from the first electrically conducting material and having a width larger than that of the first layer, and the third gate electrode is formed by using the first electrically conducting material.

9. A thin-film transistor device comprising:
   a first thin-film transistor of n-type of electric conduction having a first channel region, a first low-concentration impurity region and a first gate electrode covering nearly the whole first low-concentration impurity region and the first channel region;
   a second thin-film transistor of n-type of electric conduction having a second channel region, a second low-concentration impurity region and a second gate electrode covering part of the second low-concentration impurity region and the second channel region; and
   a third thin-film transistor of p-type of electric conduction having a third channel region and a third gate electrode covering the third channel region, wherein:

the impurities are contained at different concentrations in the first and second channel regions and in the third channel region;

the first and second gate electrodes and the third gate electrode are formed in different structures or by using different materials;

the first to third channel regions contain impurities of the p-type only, and the first and second channel regions contain impurities of the p-type at a concentration higher than that in the third channel region; and the first and second gate electrodes have a laminated layer structure including a first layer formed by using a first electrically conducting material and a second layer formed on the first layer by using a second electrically conducting material different from the first electrically conducting material and having a width larger than that of the first layer, and the third gate electrode has a laminated layer structure including a third layer formed by using the first electrically conducting material and a fourth layer formed on the third layer by using the second electrically conducting material and having a width nearly the same as that of the third layer.

* * * * *